United States Patent
Lee

(10) Patent No.: US 9,165,897 B2
(45) Date of Patent: Oct. 20, 2015

(54) SEMICONDUCTOR PACKAGE HAVING UNIFIED SEMICONDUCTOR CHIPS

(71) Applicant: Samsung Electronics Co., Ltd., Suwon-si, Gyeonggi-do (KR)

(72) Inventor: In Lee, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 9 days.

(21) Appl. No.: 14/028,534

(22) Filed: Sep. 16, 2013

(65) Prior Publication Data

US 2014/0124956 A1 May 8, 2014

(30) Foreign Application Priority Data

Nov. 5, 2012 (KR) .................. 10-2012-0124423

(51) Int. Cl.
*H01L 23/00* (2006.01)
*H01L 25/065* (2006.01)
(Continued)

(52) U.S. Cl.
CPC *H01L 24/06* (2013.01); *G11C 5/02* (2013.01); *H01L 23/50* (2013.01); *H01L 23/5386* (2013.01); *H01L 24/17* (2013.01); *H01L 24/49* (2013.01); *H01L 24/94* (2013.01); *H01L 25/0657* (2013.01); *H01L 24/05* (2013.01); *H01L 24/13* (2013.01); *H01L 24/16* (2013.01); *H01L 24/48* (2013.01); *H01L 25/18* (2013.01); *H01L 2224/0401* (2013.01); *H01L 2224/04042* (2013.01); *H01L 2224/06155* (2013.01); *H01L 2224/131* (2013.01); *H01L 2224/16145* (2013.01); *H01L 2224/16146* (2013.01); *H01L 2224/17155* (2013.01); *H01L 2224/32145* (2013.01); *H01L 2224/48145* (2013.01); *H01L 2224/48227* (2013.01);
(Continued)

(58) Field of Classification Search
CPC ............. H01L 2924/00; H01L 2224/73265; H01L 2224/32145; H01L 2224/48145
USPC ........... 257/E21.237, E21.499, E25.013, 678; 438/106, 113, 460
See application file for complete search history.

(56) References Cited

U.S. PATENT DOCUMENTS 6,943,430 B2 * 9/2005 Kwon ........................... 257/620
7,215,018 B2    5/2007 Vindasius et al.
(Continued)

FOREIGN PATENT DOCUMENTS

KR    20050059791 A    6/2005
KR    100594316 B1     6/2006
(Continued)

*Primary Examiner* — Jaehwan Oh
(74) *Attorney, Agent, or Firm* — Renaissance IP Law Group LLP

(57) ABSTRACT

A semiconductor package includes one or more semiconductor stack structures mounted on a package board. The semiconductor stack structures include sequentially stacked first to fourth semiconductor devices. Each of the first to fourth semiconductor devices includes a first unit semiconductor chip and a second unit semiconductor chip. The first unit semiconductor chip and the second unit semiconductor chip are unitary. A method for fabricating the semiconductor package includes forming pairs of unit semiconductor chips on a wafer, forming a scribe lane between the pairs of unit semiconductor chips, separating the pairs of unit semiconductor chips into semiconductor devices, each of the semiconductor devices having a corresponding one pair of unit semiconductor chips.

20 Claims, 33 Drawing Sheets

(51) Int. Cl.
*G11C 5/02* (2006.01)
*H01L 23/50* (2006.01)
*H01L 23/538* (2006.01)
*H01L 25/18* (2006.01)

(52) U.S. Cl.
CPC ............... *H01L 2224/49176* (2013.01); *H01L 2224/73204* (2013.01); *H01L 2224/97* (2013.01); *H01L 2225/0651* (2013.01); *H01L 2225/06506* (2013.01); *H01L 2225/06513* (2013.01); *H01L 2225/06517* (2013.01); *H01L 2225/06541* (2013.01); *H01L 2225/06562* (2013.01)

(56) References Cited

U.S. PATENT DOCUMENTS

| | | | |
|---|---|---|---|
| 7,592,237 B2 | 9/2009 | Sakamoto et al. | |
| 7,795,073 B2 | 9/2010 | Han et al. | |
| 8,838,885 B2 * | 9/2014 | Kwak et al. ................. | 711/103 |
| 2009/0152692 A1 * | 6/2009 | Chow et al. ................. | 257/668 |
| 2009/0197372 A1 * | 8/2009 | Han et al. ................... | 438/109 |
| 2009/0230548 A1 * | 9/2009 | Park et al. ................... | 257/737 |
| 2009/0321893 A1 * | 12/2009 | Somasekhar et al. ........ | 257/621 |
| 2010/0044861 A1 * | 2/2010 | Chiu et al. .................. | 257/738 |
| 2010/0311227 A1 | 12/2010 | Hatakeyama et al. | |
| 2011/0033980 A1 * | 2/2011 | Chung ........................ | 438/109 |
| 2011/0095413 A1 * | 4/2011 | Barth et al. ................. | 257/685 |
| 2011/0180916 A1 * | 7/2011 | Han ............................ | 257/676 |
| 2011/0180937 A1 * | 7/2011 | Choi et al. .................. | 257/777 |
| 2011/0285025 A1 * | 11/2011 | Gong ......................... | 257/773 |
| 2012/0056327 A1 | 3/2012 | Harada et al. | |
| 2012/0171814 A1 * | 7/2012 | Choi et al. .................. | 438/107 |
| 2012/0317332 A1 * | 12/2012 | Kwak et al. ................ | 711/102 |
| 2013/0099393 A1 * | 4/2013 | Jeong et al. ................ | 257/777 |

FOREIGN PATENT DOCUMENTS

| | | |
|---|---|---|
| KR | 20060075073 A | 7/2006 |
| KR | 20110083278 A | 7/2011 |
| KR | 20110107989 A | 10/2011 |

\* cited by examiner

SEMICONDUCTOR PACKAGE HAVING UNIFIED SEMICONDUCTOR CHIPS

CROSS-REFERENCE TO RELATED APPLICATION

This application claims priority under 35 U.S.C. §119 to Korean Patent Application No. 10-2012-0124423 filed on Nov. 5, 2012, the disclosure of which is hereby incorporated by reference in its entirety.

BACKGROUND

1. Field

Embodiments of the inventive concept relate to a semiconductor package, and more particularly to a semiconductor package including unified semiconductor chips.

2. Description of Related Art

As semiconductor packages are improved to be small and thin, technology for horizontally arranging and vertically stacking the semiconductor packages is more frequently being applied.

SUMMARY

Embodiments of the inventive concept provide a semiconductor package having a semiconductor stack structure configured to reduce the area occupied.

Other embodiments of the inventive concept provide a semiconductor package in which semiconductor devices having a plurality of horizontally arranged unit semiconductor chips are vertically stacked.

Still other embodiments of the inventive concept provide methods of fabricating semiconductor packages having semiconductor stack structures configured to reduce the area occupied.

Still other embodiments of the inventive concept provide methods of fabricating semiconductor packages in which semiconductor devices having a plurality of horizontally arranged unit semiconductor chips are vertically stacked.

The technical objectives of the inventive concept are not limited to the above disclosure; other objectives may become apparent to those of ordinary skill in the art based on the following descriptions.

In accordance with an aspect of the inventive concept, a semiconductor package includes a semiconductor stack structure mounted on a package board. The semiconductor stack structure may include sequentially stacked first to fourth semiconductor devices, each of the first to fourth semiconductor devices includes a first unit semiconductor chip and a second unit semiconductor chip, and the first unit semiconductor chip and the second unit semiconductor chip are unified at a wafer-level.

Each of the first to fourth semiconductor devices further comprises a corresponding boundary region located between the first unit semiconductor chip and the second unit semiconductor chip. The boundary regions of the first to fourth semiconductor devices may be vertically aligned. Each of the boundary regions of the first to fourth semiconductor devices may include a scribe lane. Top surfaces and bottom surfaces of the first unit semiconductor chip, the second unit semiconductor chip, and the corresponding boundary region may be horizontally flat. The first unit semiconductor chip, the second unit semiconductor chip, and the corresponding boundary region may be horizontally physically continuous for each of the first to fourth semiconductor devices.

In accordance with another aspect of the inventive concept, a semiconductor package may include a semiconductor stack structure mounted on a package board. The semiconductor stack structure may include sequentially stacked semiconductor devices which are structurally the same as each other. Each of the structurally same semiconductor devices may include a plurality of unit semiconductor chips. The plurality of unit semiconductor chips may be structurally the same as each other. The plurality of the structurally same unit semiconductor chips included in one semiconductor device from among the semiconductor devices, may be unitary and physically continuous with each other.

A method for fabricating a semiconductor package may include forming a plurality of pairs of unit semiconductor chips on a wafer, forming a scribe lane between individual unit semiconductor chips from among each of the plurality of pairs of unit semiconductor chips, and separating the pairs of unit semiconductor chips into a plurality of semiconductor devices, each of the semiconductor devices having a corresponding one pair of unit semiconductor chips from among the plurality of pairs of unit semiconductor chips.

Details of other embodiments are included in the detailed description and drawings.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EMBODIMENTS

Figure 1A:
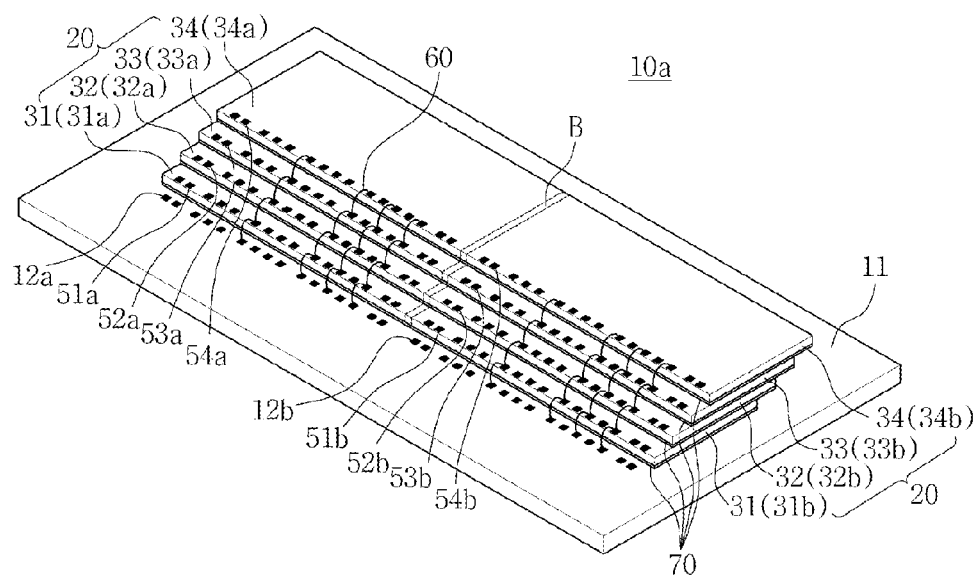
FIGS. 1A to 1D are a perspective view, a top view, a vertical cross-sectional view, and a side view, respectively, schematically showing a semiconductor package in accordance with an embodiment of the inventive concept.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough, complete, and fully conveys the inventive concept to those skilled in the art. In the drawings, the sizes and relative sizes of layers and regions may be exaggerated for clarity.

It will be understood that when an element is referred to as being "connected" or "coupled" to another element, it can be directly connected or coupled to the other element, or intervening elements may be present. In contrast, when an element is referred to as being "directly connected" or "directly coupled" to another element, there are no intervening elements. Other words used to describe relationships between elements should be interpreted in a like fashion (i.e., "between" versus "directly between," "adjacent" versus "directly adjacent," etc.).

It will be understood that, although the terms first, second, A, B, etc. may be used herein in reference to elements of the invention, such elements should not be construed as limited by these terms. For example, a first element could be termed a second element, and a second element could be termed a first element, without departing from the scope of the inventive concepts. Herein, the term "and/or" includes any and all combinations of one or more of the associated listed items.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (e.g., rotated 90 degrees or at other orientations) and the spatially relative descriptors used herein interpreted accordingly.

The terminology used herein to describe embodiments of the invention is not intended to limit the scope of the invention. The articles "a," "an," and "the" are intended to include the plural forms as well, unless the context clearly indicates otherwise. In other words, elements of the invention referred to in the singular may number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Unless otherwise defined, all terms (including technical and scientific terms) used herein are to be interpreted as is customary in the art to which this invention belongs. It will be further understood that terms in common usage should also be interpreted as is customary in the relevant art and not in an idealized or overly formal sense unless expressly so defined herein.

FIGS. 1A to 1D are a perspective view, a top view, a vertical cross-sectional view, and a side view, respectively, schematically showing a semiconductor package in accordance with an embodiment of the inventive concept.

Referring to FIGS. 1A to 1D, the semiconductor package 10*a* in accordance with an embodiment may include a semiconductor stack structure 20 mounted on a package board 11. The semiconductor stack structure 20 may include a plurality of semiconductor devices 31 to 34 stacked in a form of a unidirectional cascade. For example, the semiconductor devices 31 to 34 may be stacked in forms of steps to expose parts of upper surfaces thereof. Although four-story stack semiconductor devices 31 to 34 are illustrated in the drawings, the semiconductor devices may be stacked in increments greater than four-stories, preferably to a number corresponding to a multiple of four.

Figure 1B:
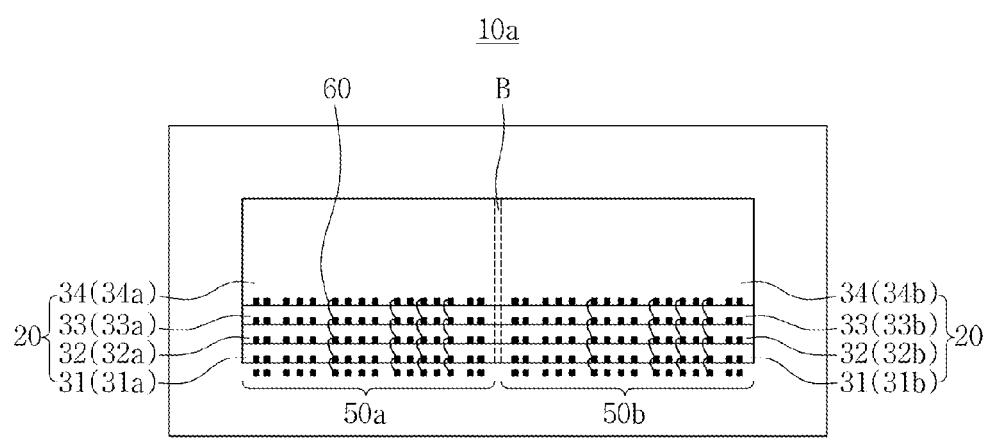

Chip pads 51*a* to 54*a* and 51*b* to 54*b* may be arranged on the exposed upper surface of each of the semiconductor devices 31 to 34, respectively. The chip pads 51*a* to 54*a* and 51*b* to 54*b* of each of the semiconductor devices 31 to 34, respectively, may be arranged in the same shape. For example, each of the chip pads 51*a* to 54*a* may have a first array 50*a*, and each of the chip pads 51*b* to 54*b* may have a second array 50*b*, as shown in FIG. 1B. The first array 50*a* may have similar structural characteristics as the second array 50*b*. The first array 50*a* may be the same, or have the same structural characteristics, as the second array 50*b*. In addition, chip pads corresponding to the same relative positions among the chip pads (e.g., 51*a* to 54*a* and 51*b* to 54*b*) of each of the semiconductor devices 31 to 34, respectively, may be electrically connected to each other sequentially through bonding wires 60. Although the terms "wire" and "wires" are used herein, it will be understood that any suitable conductor can be used when referring to such terms. For example, arbitrary Nth chip pads 51*a* to 54*a* of the semiconductor devices 31 to 34, respectively, may be electrically connected to each other. Similarly, arbitrary Nth chip pads 51*b* to 54*b* of the semiconductor devices 31 to 34, respectively, may be electrically connected to each other. Only a few bonding wires 60 are illustrated in the drawings in order to prevent the drawings from being unnecessarily complicated. It will be understood, however, that bonding wires 60 can be similarly disposed on other chip pads of the respective semiconductor devices 31 to 34. The chip pads 51*a* to 54*a* and 51*b* to 54*b* may be arranged to be adjacent to one edge of each of the semiconductor devices 31 to 34, respectively. But differently, the chip pads 51*a* to 54*a* and 51*b* to 54*b* may be arranged to be adjacent to a long edge of each of the semiconductor devices 31 to 34, respectively, and arranged not to be adjacent to the other three edges (among four total edges) of each of the semiconductor devices 31 to 34.

Each of the semiconductor devices 31 to 34 may include semiconductor chips 31a to 34a, respectively, and semiconductor chips 31b to 34b, respectively. First and second unit semiconductor chips may include, for example, a pair of chips such as 31a and 31b (i.e., 31a/31b). The pairs of first and second unit semiconductor chips (e.g., 31a/31b, 32a/32b, 33a/33b, and 34a/34b) included in one of the semiconductor devices 31 to 34 may be unified or un-divided from a wafer. In addition, the pairs of first and second unit semiconductor chips may be horizontally physically continuous. For example, each of the pairs of first and second unit semiconductor chips (e.g., 31a/31b, 32a/32b, 33a/33b, and 34a/34b) may be in a wafer-level state where the pairs of first and second unit semiconductor chips (e.g., 31a/31b, 32a/32b, 33a/33b, and 34a/34b) are not divided or sawn. Accordingly, boundary regions B may exist between the pairs of first and second unit semiconductor chips 31a/31b, 32a/32b, 33a/33b, and 34a/34b. The boundary regions B may correspond to scribe lanes in the wafer. The boundary regions B of the semiconductor devices 31 to 34 may be vertically aligned. Various test element groups (TEG) and/or alignment key patterns may exist in the boundary regions B.

Since the boundary regions B may be parts of the wafer, the boundary regions B may include single crystalline silicon, silicon oxide, silicon nitride, a metal, etc. Single crystalline silicon, silicon oxide, silicon nitride, a metal, etc. may be horizontally continuous in the pairs of first and second unit semiconductor chips 31a/31b, 32a/32b, 33a/33b, and 34a/34b and the boundary regions B. Each of the pairs of first and second unit semiconductor chips 31a/31b, 32a/32b, 33a/33b, and 34a/34b and the associated boundary region from among the boundary regions B may have co-planar bottom surfaces. For example, the pairs of first and second unit semiconductor chips 31a/31b, 32a/32b, 33a/33b, and 34a/34b and the associated boundary region from among the boundary regions B may be ground at the same time, and therefore have the same flat bottom surfaces. In addition, the pairs of first and second unit semiconductor chips 31a/31b, 32a/32b, 33a/33b, and 34a/34b and the associated boundary region from among the boundary regions B may have substantially co-planar top surfaces.

The pairs of first and second unit semiconductor chips 31a/31b, 32a/32b, 33a/33b, and 34a/34b and the associated boundary region from among the boundary regions B may pass through the same process, and therefore have substantially the same top surfaces. Moreover, the pairs of first and second unit semiconductor chips 31a/31b, 32a/32b, 33a/33b, and 34a/34b may be the same as each other. For example, the pairs of first and second unit semiconductor chips 31a to 34a and 31b to 34b, respectively, included in a semiconductor device 31 to 34 may be twins. Accordingly, the pairs of first and second chip pads 51a/51b, 52a/52b, 53a/53b, and 54a/54b of the pairs of first and second unit semiconductor chips 31a/31b, 32a/32b, 33a/33b, and 34a/34b, respectively, may have the same array as each other. For example, arbitrary Nth chip pads 51a to 54a of the first unit semiconductor chips 31a to 34a, respectively, may be electrically connected to each other through the bonding wires 60. In addition, arbitrary Nth chip pads 51b to 54b of the second unit semiconductor chips 31b to 34b, respectively, may be electrically connected to each other through the bonding wires 60.

The package board 11 may include a printed circuit board (PCB). The package board 11 may include first and second board pads 12a and 12b arranged adjacent to the first and second chip pads 51a and 51b of the lowermost semiconductor device 31. The first and second board pads 12a and 12b may include the same array pattern as each of the pairs of first and second chip pads 51a/51b, 52a/52b, 53a/53b, and 54a/54b of the semiconductor devices 31 to 34. Some of the first and second board pads 12a and 12b arranged adjacent to the first and second chip pads 51a and 51b of the lowermost semiconductor device 31 may be electrically connected to some of the adjacent first and second chip pads 51a and 51b having substantially the same locations, through the bonding wires 60.

A die attach film (DAF) 70 may be formed between the package board 11 and the lowermost semiconductor device 31, and between the semiconductor devices 32 to 34. The die attach film 70 may be formed on a part of or entirely cover each bottom surface of the semiconductor devices 31 to 34. The die attach film 70 may include an adhesive resin.

Figure 1C:
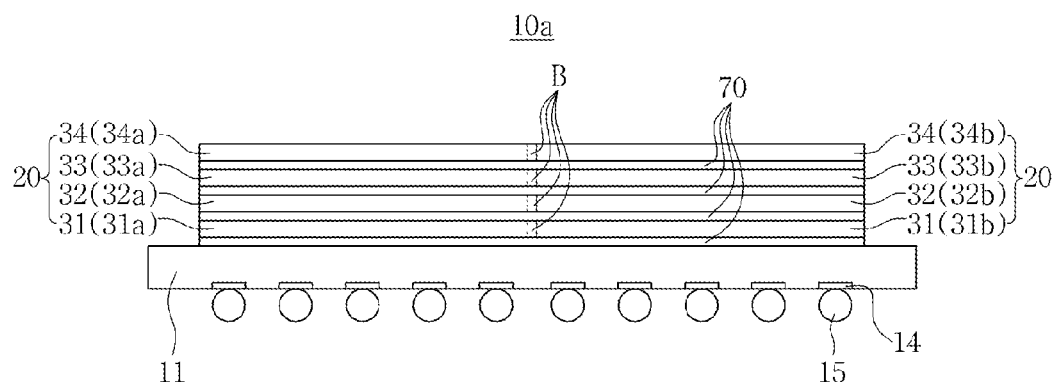
Figure 1D:
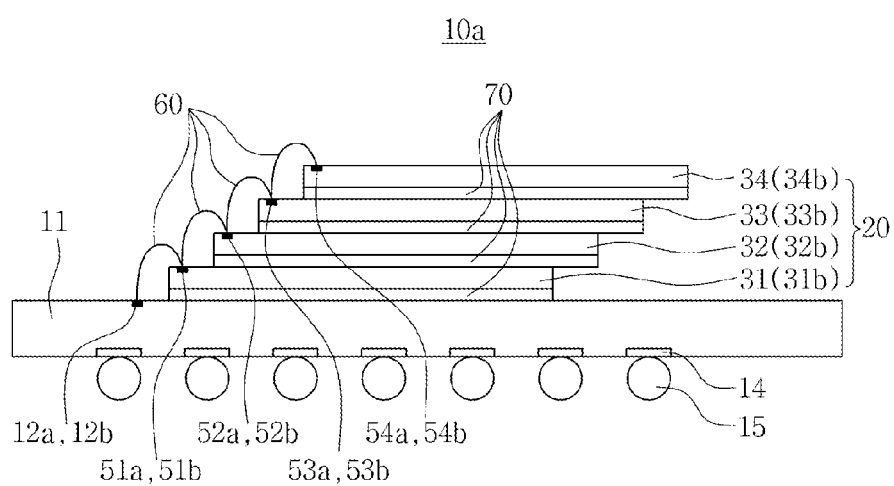

Bump pads 14 and bumps 15 may be arranged in a bottom region of the package board 11, as shown in FIG. 1C. The bump pads 14 may be electrically connected to the first and second board pads 12a and 12b. The bumps 15 may provide electrical connections with a motherboard or a module board.

Since the semiconductor package 10a in accordance with the embodiment includes horizontally continuously arranged pairs of first and second unit semiconductor chips 31a/31b, 32a/32b, 33a/33b, and 34a/34b, the semiconductor package 10a may have improved integration by as much as two times, while having the same vertical stack height. For example, since each of the pairs of first and second unit semiconductor chips 31a/31b, 32a/32b, 33a/33b, and 34a/34b are stacked without being cut at the wafer-level, the distance between the pairs of first and second unit semiconductor chips 31a/31b, 32a/32b, 33a/33b, and 34a/34b may be minimized. If each of the pairs of first and second unit semiconductor chips 31a/31b, 32a/32b, 33a/33b, and 34a/34b are cut and stacked, horizontally occupying areas of each the semiconductor devices 31, 32, 33, and 34 and/or each of the pairs of first and second unit semiconductor chips 31a/31b, 32a/32b, 33a/33b, and 34a/34b on the package board 11 would be large since a space or a filling material would need to be formed between the pairs of first and second unit semiconductor chips 31a/31b, 32a/32b, 33a/33b, and 34a/34b. However, in accordance with the inventive concept, the semiconductor package 10a is small and highly integrated since the horizontally occupying areas of each the semiconductor devices 31 to 34 and/or each of the pairs of first and second unit semiconductor chips 31a/31b, 32a/32b, 33a/33b, and 34a/34b on the package board 11 are minimized FIGS. 2A to 2E are schematic perspective views and side views of semiconductor packages 10b to 10f, respectively, in accordance with various embodiments of the inventive concept.

Figure 2A:
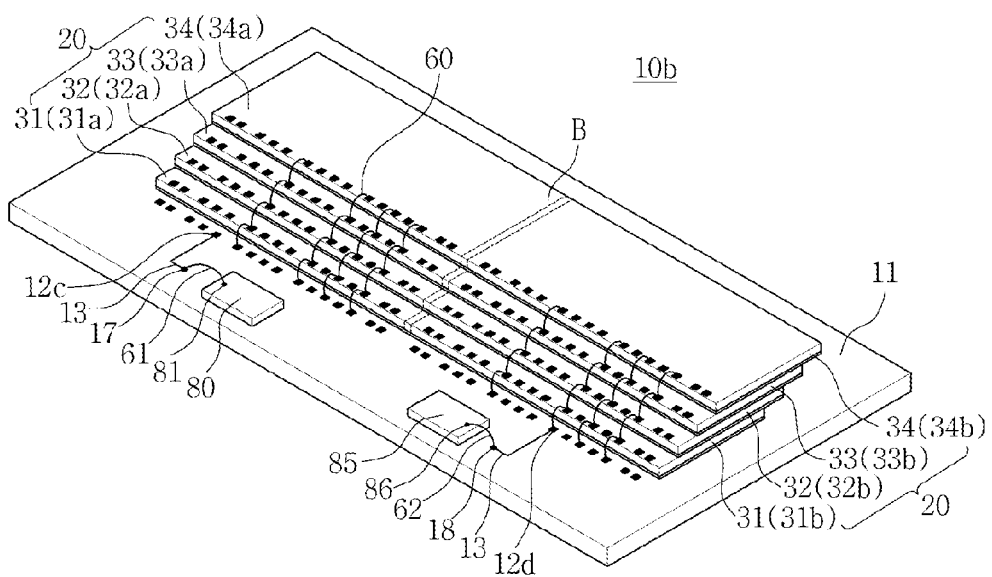
FIGS. 2A to 2E are a first perspective view, a side view, a second perspective view, a third perspective view, and a fourth perspective view, respectively, schematically showing semiconductor packages in accordance with various embodiments of the inventive concept.
Figure 2B:
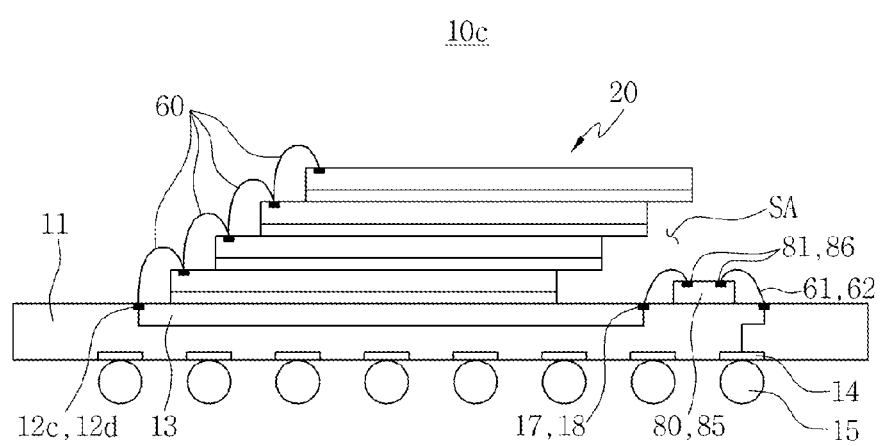

Referring to FIGS. 2A and 2B, the semiconductor packages 10b and 10c in accordance with the embodiments may include a semiconductor stack structure 20, a control device 80, and a buffering device 85 mounted on a package board 11.

Referring further to FIG. 2A, the semiconductor package 10b in accordance with an embodiment may include a control device 80 and a buffering device 85 arranged on the package board 11 to be adjacent to board pads 12c and 12d of the package board 11. The control device 80 may transfer various command signals to the semiconductor devices 31 to 34. For example, the control device 80 may transfer an enable and/or disable command signal, a selection command signal, and an address information signal, etc., to the semiconductor devices 31 to 34. The buffering device 85 may buffer data signals communicated between the control device 80 and the semiconductor devices 31 to 34. A control pad 81 of the control device 80 may be electrically connected to a control board pad 17 through a control wire 61. The control board pad 17 may be electrically connected to the board pad 12*c*, which transfers a control signal, through a board wire 13.

Similarly, a buffering pad 86 of the buffering device 85 may be electrically connected to a buffering board pad 18 through a buffering wire 62. The buffering board pad 18 may be electrically connected to a board pad 12*d*, which transfers data signals, through the board wire 13.

Referring to FIG. 2B, the semiconductor package 10*c* in accordance with an embodiment of the inventive concept may include a control device 80 and/or a buffering device 85 arranged in a shady area SA of the semiconductor stack structure 20. It will be understood that the term "shady area" is a term used to describe a particular area, as shown in the figures, and actual light or shade need not be present. In other embodiments, the control device 80 and/or the buffering device 85 may be arranged so that it is completely covered by the shady area SA of the semiconductor stack structure 20.

Referring again to FIGS. 2A and 2B, the control pad 81 and/or the buffering pad 86 of the control device 80 and/or the buffering device 85 may be electrically connected to at least one of the board pads 12*c* and 12*d* through a board wire 13. At least one of the pads may be electrically connected to a bump pad 14 through another board wire 13. The board wire 13 may be inserted in the package board 11, or the board wire 13 may include a metal lead frame separated from the package board 11. In the embodiments, a single control device 80 may control all semiconductor devices 31 to 34 and/or all unit semiconductor chips 31*a*/31*b*, 32*a*/32*b*, 33*a*/33*b*, and 34*a*/34*b*. A single buffering device 85 may buffer data signals for all of the semiconductor devices 31 to 34 and/or all of the pairs of unit semiconductor chips 31*a*/31*b*, 32*a*/32*b*, 33*a*/33*b*, and 34*a*/34*b* that communicate with the control device 80.

Figure 2C:
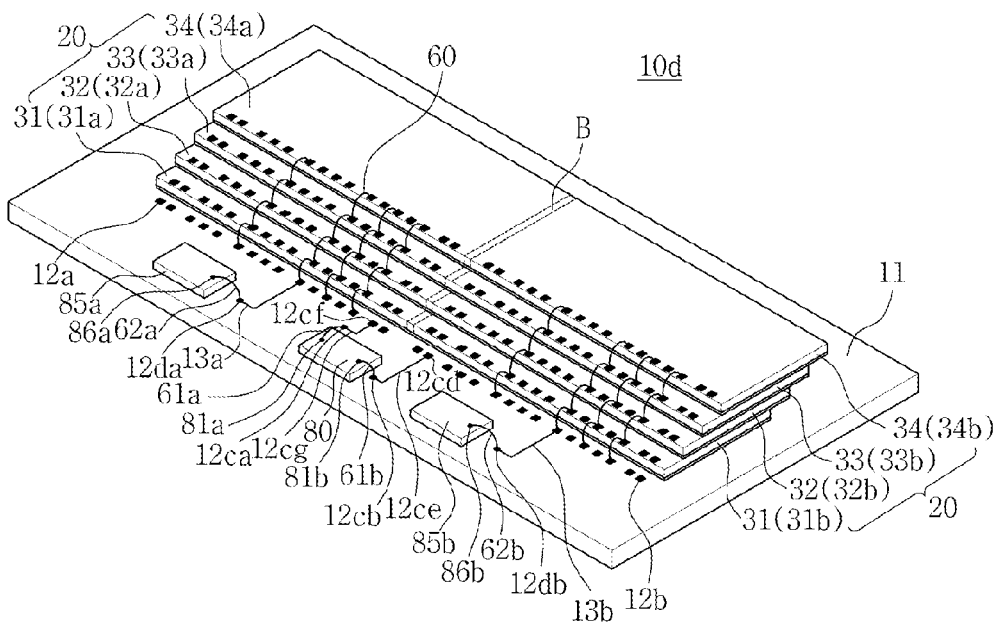

Referring to FIG. 2C, the semiconductor package 10*d* in accordance with an embodiment may include a control device 80 and two buffering devices 85*a* and 85*b*. The buffering devices 85*a* and 85*b* may correspond to the pairs of first and second unit semiconductor chips 31*a*/31*b*, 32*a*/32*b*, 33*a*/33*b*, and 34*a*/34*b*, respectively. In other words, each of the semiconductor devices 31 to 34 includes a pair of the first and second unit semiconductor chips (e.g., 31*a*/31*b*, 32*a*/32*b*, 33*a*/33*b*, and 34*a*/34*b*), and the buffering devices 85*a* and 85*b* are respectively associated with the pair of the first and second unit semiconductor chips.

The control device 80 may transfer various command signals to the semiconductor devices 31 to 34. For example, the control device 80 may transfer an enable and/or disable command signal, a selection command signal, and an address information signal, etc., to the semiconductor devices 31 to 34. The buffering devices 85*a* and 85*b* may buffer data signals communicated between the control device 80 and the semiconductor devices 31 to 34. A control pad 81*b* of the control device 80 may be electrically connected to a control board pad 12*cb* through a control wire 61*b*. The control board pad 12*cb* may be electrically connected to a board pad 12*cd*, which transfers a control signal, through a board wire 12*ce*. Another control pad 81*a* of the control device 80 may be electrically connected to a control board pad 12*ca* through a control wire 61*a*. The control board pad 12*ca* may be electrically connected to a board pad 12*cf*, which transfers a control signal, through a board wire 12*cg*.

Each of two buffering devices 85*a* and 85*b* may communicate with different semiconductor chips 31*a* to 34*a* and 31*b* to 34*b*, respectively. For example, the first unit semiconductor chips 31*a* to 34*a* located at the left of each semiconductor device from 31 to 34 may independently communicate with the buffering device 85*a* located at the left, and the second unit semiconductor chips 31*b* to 34*b* located at the right of each semiconductor device from 31 to 34 may independently communicate with the buffering device 85*b* located at the right. A first buffering pad 86*a* of the first buffering device 85*a* located at the left in FIG. 2C may be electrically connected to a board pad 12*a* through a first buffering wire 62*a*, a first buffering board pad 12*da*, and/or a first board wire 13*a*. A second buffering pad 86*b* of the second buffering device 85*b* located at the right in FIG. 2C may be electrically connected to a board pad 12*b* through a second buffering wire 62*b*, a second buffering board pad 12*db*, and a second board wire 13*b*. The buffering devices 85*a* and 85*b* may be arranged on a package board 11 to be adjacent to each of the pairs of unit semiconductor chips 31*a*/31*b*, 32*a*/32*b*, 33*a*/33*b*, and 34*a*/34*b* and board pads 12. Referring to the combination of FIGS. 2B and 2C, the buffering devices 85*a* and 85*b* may be arranged in a shady area SA.

Figure 2D:
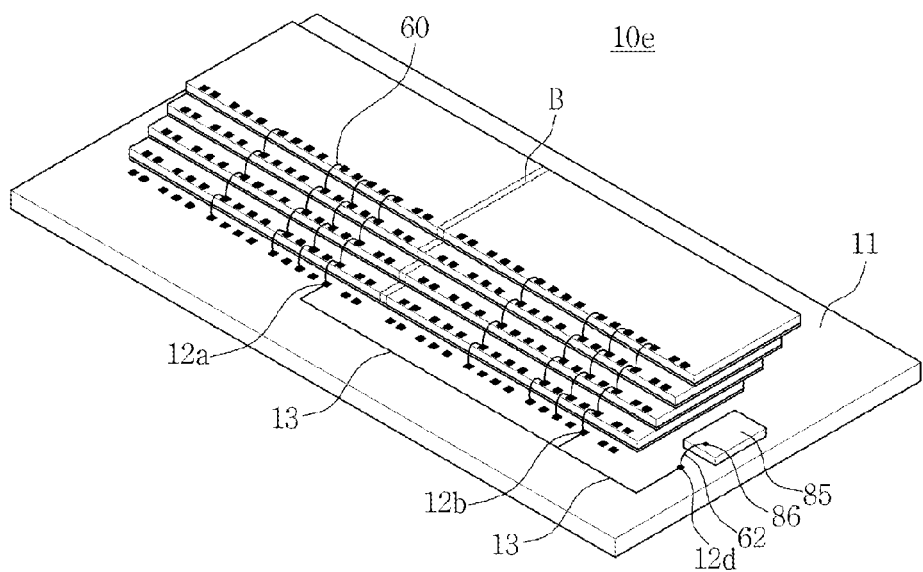

Referring to FIG. 2D, the semiconductor package 10*e* in accordance with an embodiment may include a buffering device 85 arranged to be adjacent to one of the short edges of a semiconductor stack structure 20 on a package board 11. The buffering pad 86 may be electrically connected to a board pad 12*d* for buffering through a buffering wire 62, and to board pads 12*a* and 12*b* through a board wire 13. For example, a single buffering pad 86 may be electrically connected to two or more board pads 12*a* and 12*b*. For example, the semiconductor package 10*e* in accordance with the embodiment of the inventive concept may be effectively applied when the lengths of the short edges of the semiconductor stack structure 20 are of critical concern.

Figure 2E:
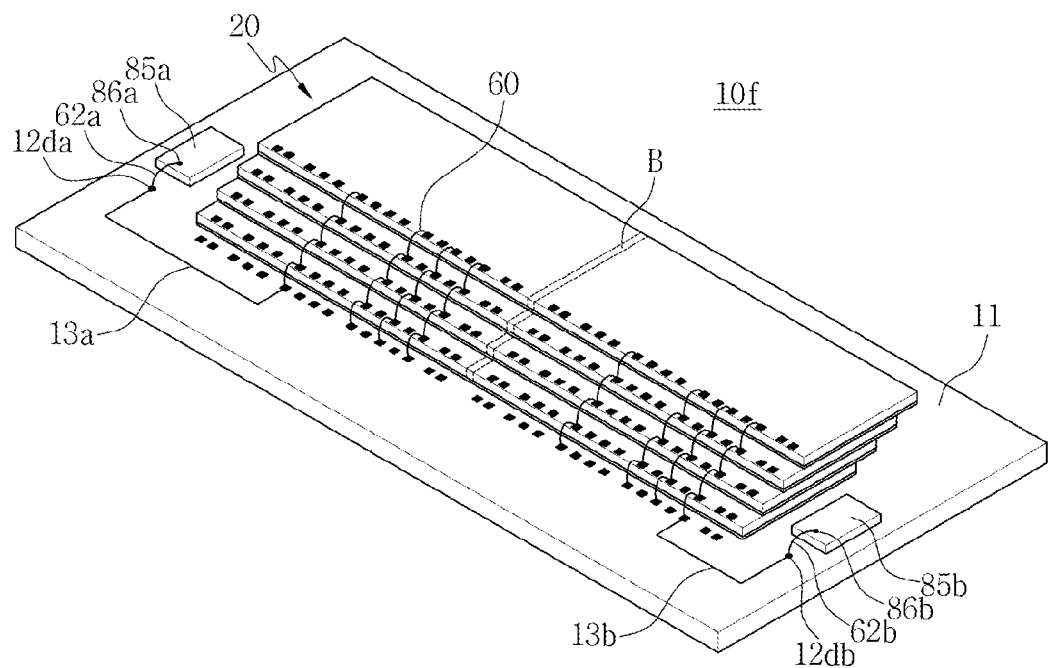

Referring to FIG. 2E, the semiconductor package 10*f* in accordance with an embodiment may include two buffering devices 85*a* and 85*b* arranged to be adjacent to two short edges of a semiconductor stack structure 20 on a package board 11. In other embodiments, one of the buffering devices 85*a* and 85*b* may be the control device 80 described in FIG. 2A or FIG. 2C.

Referring again to FIGS. 2A to 2E, arbitrary Nth chip pads of the semiconductor devices 31 to 34 or pairs of unit semiconductor chips 31*a*/31*b*, 32*a*/32*b*, 33*a*/33*b*, and 34*a*/34*b* may be electrically connected to the buffering device 85 (or devices) through the bonding wires (e.g., 60), board pads (e.g., 12*d*, 12*da*, and 12*db*), board wires (e.g., 13, 13*a*, and 13*b*), and/or the buffering pads (e.g., 86, 86*a*, and 86*b*).

When the semiconductor packages 10*b* to 10*f* include two or more buffering devices 85*a* and 85*b*, a data input/output channel becomes wider, the time for performing input/output is reduced, and data may become shortened, thereby allowing a high speed semiconductor device and system to be implemented. In addition, each of the buffering devices 85*a* and 85*b* may operate independently. In addition, a data read operation and a data write operation may be performed simultaneously.

Figure 3A:
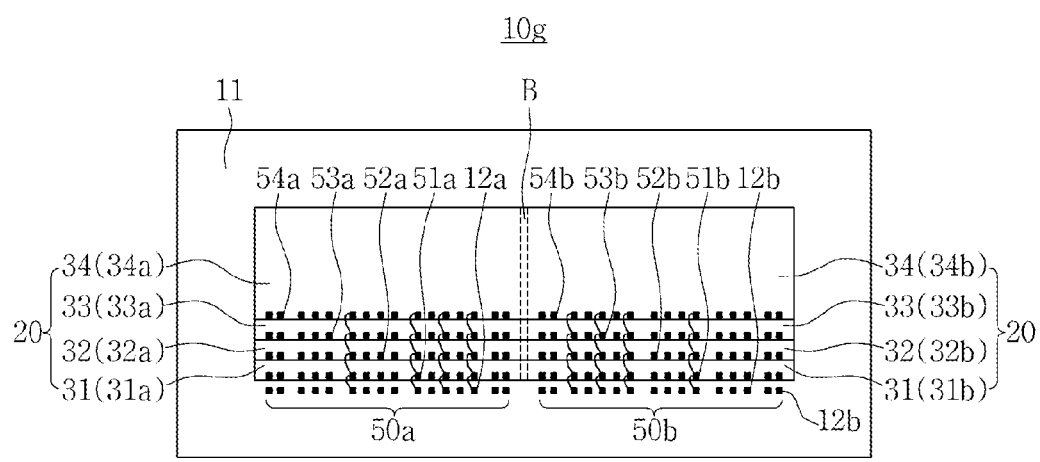
FIGS. 3A and 3B are a first top layout view and a second top layout view, respectively, schematically showing semiconductor packages in accordance with various embodiments of the inventive concept.
Figure 3B:
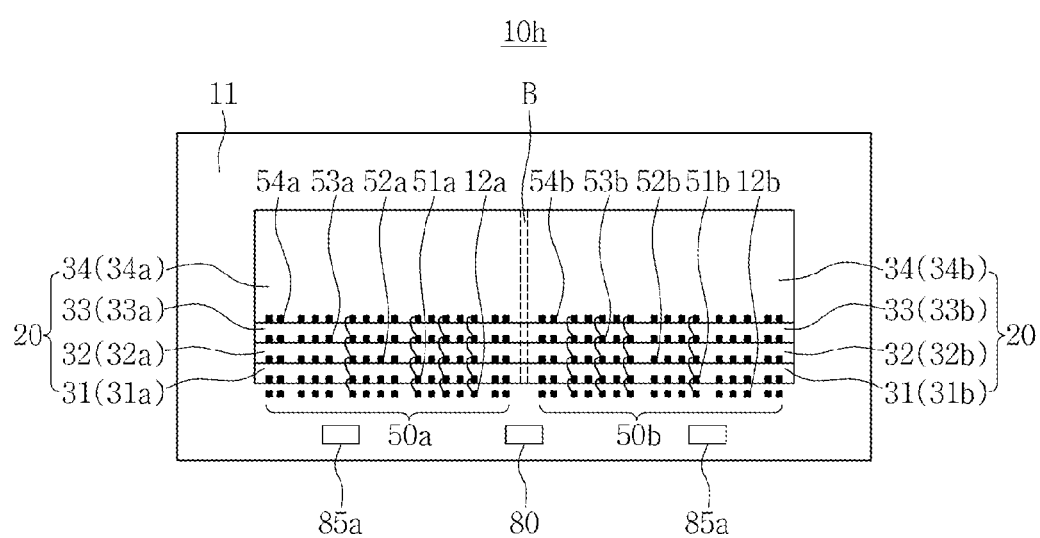

FIGS. 3A and 3B are schematic layout views of semiconductor packages 10*g* and 10*h* in accordance with embodiments of the inventive concept.

Referring to FIG. 3A, the semiconductor package 10*g* in accordance with an embodiment may include a semiconductor stack structure 20 having a plurality of semiconductor devices 31 to 34 stacked in a form of a unidirectional cascade on a package board 11. Each of the semiconductor devices 31 to 34 may include pairs of chip pads 51*a*/51*b*, 52*a*/52*b*, 53*a*/53*b*, and 54*a*/54*b* arranged in bilateral symmetry. In addition, each of the semiconductor devices 31 to 34 may include pairs of first and second unit semiconductor chips 31*a*/31*b*, 32*a*/

32b, 33a/33b, and 34a/34b. The pairs of first and second unit semiconductor chips 31a/31b, 32a/32b, 33a/33b, and 34a/34b may include the pairs of first and second chip pads 51a/51b, 52a/52b, 53a/53b, and 54a/54b with mirrored first and second arrays 50a and 50b. Board pads 12a and 12b having the same first and second arrays 50a and 50b, respectively, as the pairs of first and second chip pads 51a/51b, 52a/52b, 53a/53b, and 54a/54b, respectively, may be arranged on the package board 11. For example, the board pads 12a and 12b may also have or otherwise be associated with the mirrored first and second arrays 50a and 50b, respectively. Other components that are not described may be understood with reference to FIGS. 1A to 1D.

Referring to FIG. 3B, the semiconductor package 10h in accordance with an embodiment may include pairs of first and second chip pads 51a/51b, 52a/52b, 53a/53b, and 54a/54b and/or first and second board pads 12a and 12b having or otherwise associated with first and second arrays 50a and 50b, respectively, in bilateral symmetry. In addition, the semiconductor package 10h may include a control device 80, a first buffering device 85a, and a second buffering device 85b. For example, the control device 80 may be arranged on a package board 11 to be adjacent to a boundary region B. Each of the first and second buffering devices 85a and 85b may be respectively arranged at each side of the control device 80 such that they are adjacent to the pairs of first and second unit semiconductor chips 31a/31b, 32a/32b, 33a/33b, and 34a/34b. Example electrical connections between the control device 80 and the first and second buffering devices 85a and 85b are illustrated and described above, and are therefore omitted in FIG. 3B.

Referring back to FIG. 2A, the semiconductor packages 10g and 10h (of FIGS. 3A and 3B) may include a single buffering device (e.g., 85) only. Referring back to FIG. 2B, the semiconductor packages 10g and 10h (of FIGS. 3A and 3B) may include the control device 80 and/or the buffering device 85 arranged at a shady area SA of the semiconductor stack structure 20. Referring back to FIGS. 2D and 2E, the semiconductor packages 10g and 10h (of FIGS. 3A and 3B) may include the control device 80 and/or the first and second buffering devices 85a and 85b arranged to be adjacent to the short edges of the semiconductor stack structures 20.

Since the semiconductor packages 10a to 10h described in FIGS. 1A to 3B include pairs of the first and second chip pads 51a/51b, 52a/52b, 53a/53b, and 54a/54b, and the first and second board pads 12a and 12b arranged in various forms, the semiconductor packages 10a to 10h may be applied to various forms of arrangement of input/output circuits or terminals. For example, the package board 11 may include various internal routings depending on the first and second arrays 50a and 50b of the first and second board pads 12a and 12b, respectively. The internal routings may be diversified and/or simplified depending on the pairs of first and second chip pads 51a/51b, 52a/52b, 53a/53b, and 54a/54b or the first and second board pads 12a and 12b having the same array or mirrored array. Accordingly, the pairs of first and second chip pads 51a/51b, 52a/52b, 53a/53b, and 54a/54b or the first and second board pads 12a and 12b arranged in various forms may increase the degree of freedom in circuit design of the semiconductor packages 10a to 10h, semiconductor devices 31 to 34, and/or the pairs of unit semiconductor chips 31a/31b, 32a/32b, 33a/33b, and 34a/34b. For example, when the semiconductor stack structure 20 includes a control device 80 and one or more buffering devices 85a and 85b, control board pads (e.g., 12ca and 12cb of FIG. 2C) connected to the control device 80 may be arranged to be adjacent to the boundary region B, and buffering board pads (e.g., 12da and 12db of FIG. 2C) connected to buffering devices (e.g., 85, 85a, and 85b) may be arranged to be relatively further away from the boundary region B.

FIGS. 4A to 4D are schematic top views of semiconductor packages 10i and 10j in accordance with embodiments of the inventive concept.

Figure 4A:
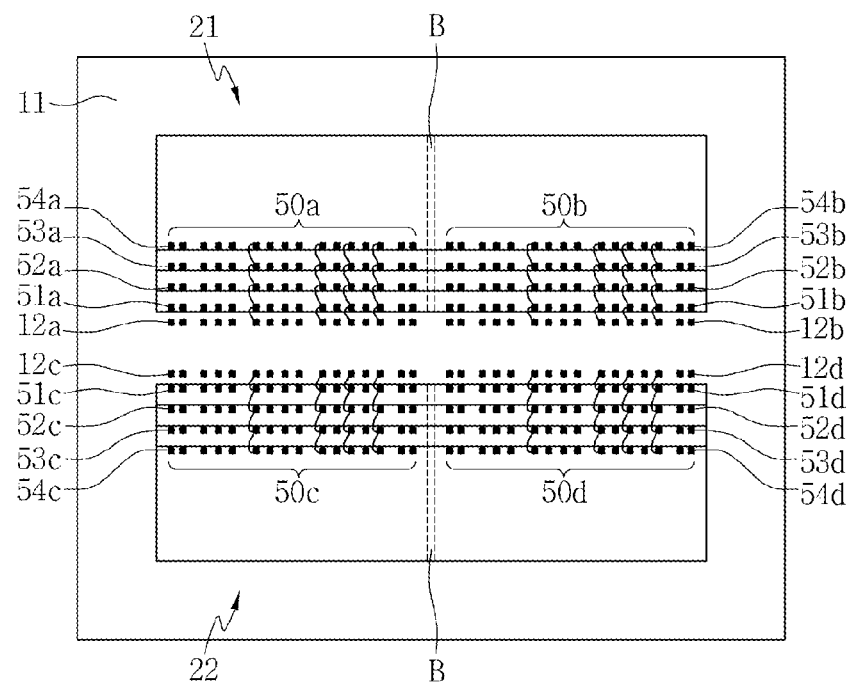
FIGS. 4A to 4D are first to fourth top views, respectively, schematically showing semiconductor packages in accordance with various embodiments of the inventive concept.

Referring to FIG. 4A, the semiconductor package 10i in accordance with an embodiment may include a first stack structure 21 and a second stack structure 22 stacked to face each other on the package board 11. First and second arrays 50a and 50b of pairs of first and second chip pads 51a/51b, 52a/52b, 53a/53b, and 54a/54b and/or first and second board pads 12a and 12b in the first stack structure 21, and third and fourth arrays 50c and 50d of pairs of third and fourth chip pads 51c/51d, 52c/52d, 53c/53d, and 54c/54d and/or third and fourth board pads 12c and 12d in the second stack structure 22, may face each other in the relation of axial symmetric states or mirroring states.

Figure 4B:
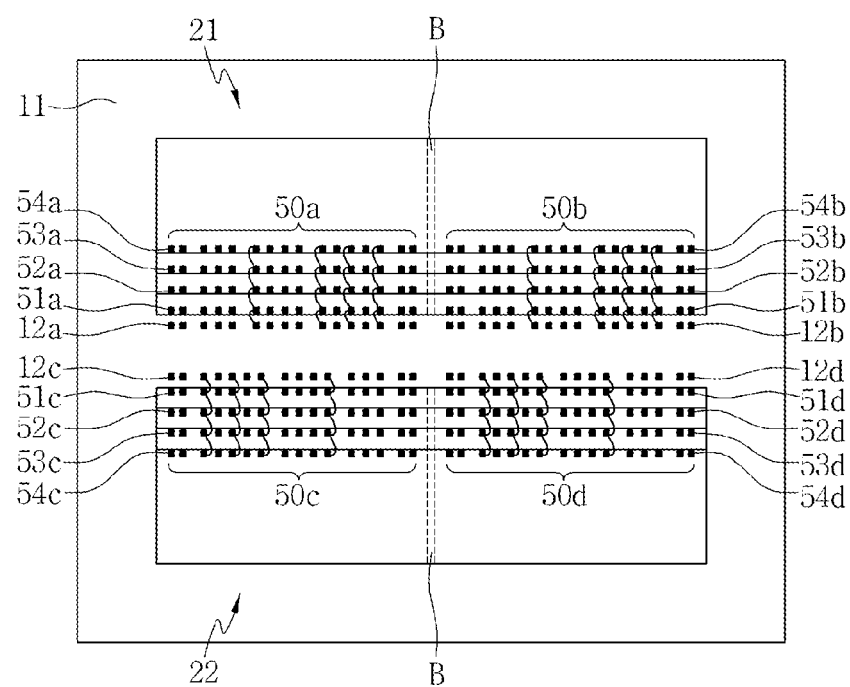

Referring to FIG. 4B, the semiconductor package 10j in accordance with an embodiment of the inventive concept may include a first stack structure 21 and a second stack structure 22 stacked to face each other on a package board 11. The first stack structure 21 and the second stack structure 22 may have the same shape. For example, the first and second arrays 50a and 50b of the pairs of first and second chip pads 51a/51b, 52a/52b, 53a/53b, and 54a/54b and/or first and second board pads 12a and 12b in the first stack structure 21, and third and fourth arrays 50c and 50d of pairs of third and fourth chip pads 51c/51d, 52c/52d, 53c/53d, and 54c/54d and/or third and fourth board pads 12c and 12d in the second stack structure 22, may be in the relation of point symmetry to each other.

Figure 4C:
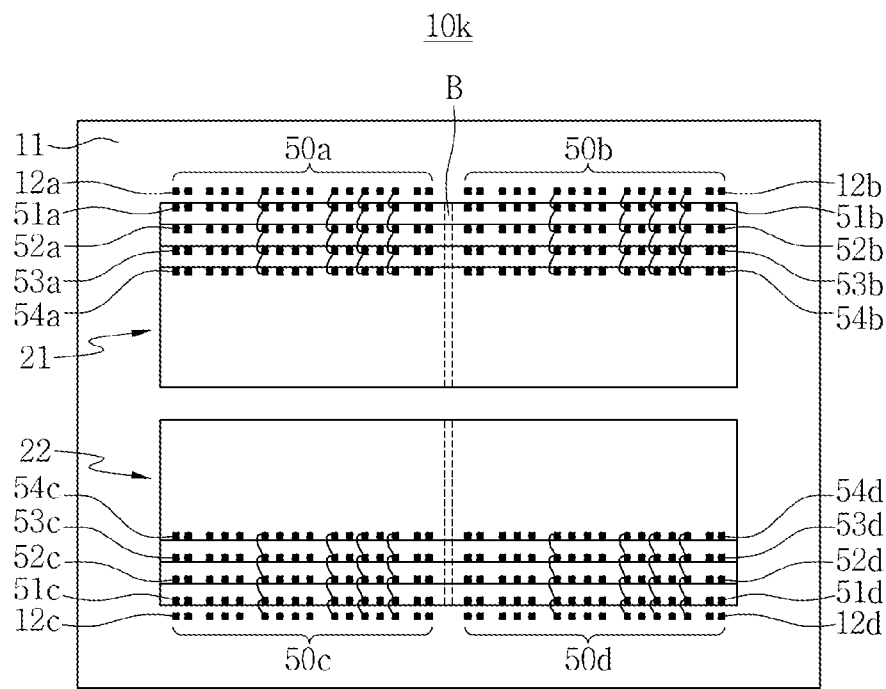

Referring to FIG. 4C, the semiconductor package 10k in accordance with an embodiment may include a first stack structure 21 and a second stack structure 22 stacked to face opposite directions from each other on a package board 11. First and second arrays 50a and 50b of pairs of first and second chip pads 51a/51b, 52a/52b, 53a/53b, and 54a/54b and/or first and second board pads 12a and 12b in the first stack structure 21, and third and fourth arrays 50c and 50d of pairs of third and fourth chip pads 51c/51d, 52c/52d, 53c/53d, and 54c/54d and/or third and fourth board pads 12c and 12d in the second stack structure 22, may face each other or face opposite directions from each other in the relation of line symmetry.

Figure 4D:
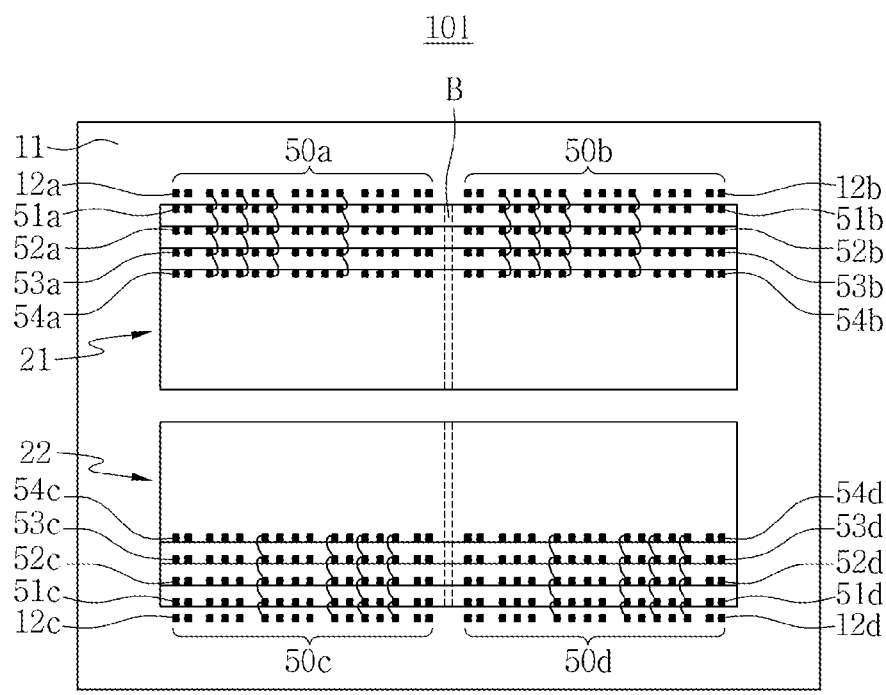

Referring to FIG. 4D, the semiconductor package 10l in accordance with an embodiment may include a first stack structure 21 and a second stack structure 22 stacked to face opposite directions from each other on a package board 11. The first stack structure 21 and the second stack structure 22 may have the same shape. For example, the first and second arrays 50a and 50b of pairs of the first and second chip pads 51a/51b, 52a/52b, 53a/53b, and 54a/54b and/or first and second board pads 12a and 12b in the first stack structure 21, and third and fourth arrays 50c and 50d of pairs of third and fourth chip pads 51c/51d, 52c/52d, 53c/53d, and 54c/54d and/or third and fourth board pads 12c and 12d in the second stack structure 22, may be in the relation of point symmetry to each other.

Referring back to FIGS. 2A and 2B, the semiconductor packages 10i to 10l (of FIGS. 4A to 4D) may include a control device 80 and at least one buffering device 85 arranged in various locations. The control device 80 and/or the buffering device 85 may be arranged between the first stack structure 21 and the second stack structure 22, at both sides of the first stack structure 21 and second stack structure 22, and/or in shady areas SA of the first stack structure 21 and second stack structure 22.

Referring back to FIG. 2C, the semiconductor packages 10*i* to 10*l* (of FIGS. 4A to 4D) may include first and second buffering devices 85*a* and 85*b* to correspond to the first stack structure 21 and the second stack structure 22, respectively. In other embodiments, the semiconductor packages 10*i* to 10*l* may include first to fourth buffering devices (e.g., such as 85, 85*a*, and 85*b*) each associated with a corresponding group of four unit semiconductor chips 51*a* to 51*d*, 52*a* to 52*d*, 53*a* to 53*d*, and 54*a* to 54*d* stacked on the same layer.

Referring back to FIGS. 2D to 2E, the semiconductor packages 10*i* to 10*l* (of FIGS. 4A to 4D) may include a control device 80 and/or two or four buffering devices (e.g., such as 85*a* and 85*b*) arranged to be adjacent to short edges of the first and second semiconductor stack structures 21 and 22.

Figure 5A:
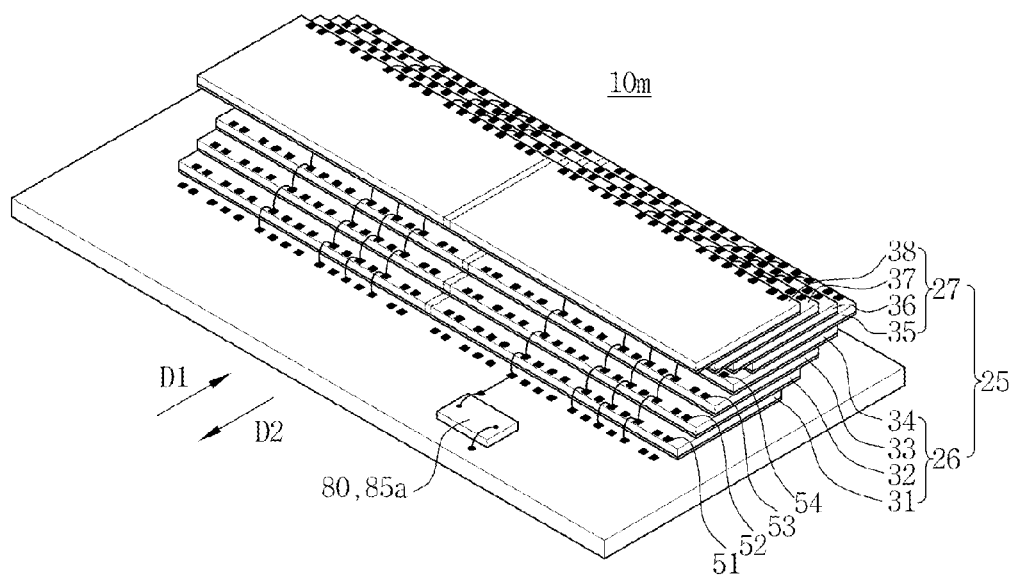
FIGS. 5A and 5B are a perspective view and a side view, respectively, schematically showing semiconductor packages in accordance with various embodiments of the inventive concept.
Figure 5B:
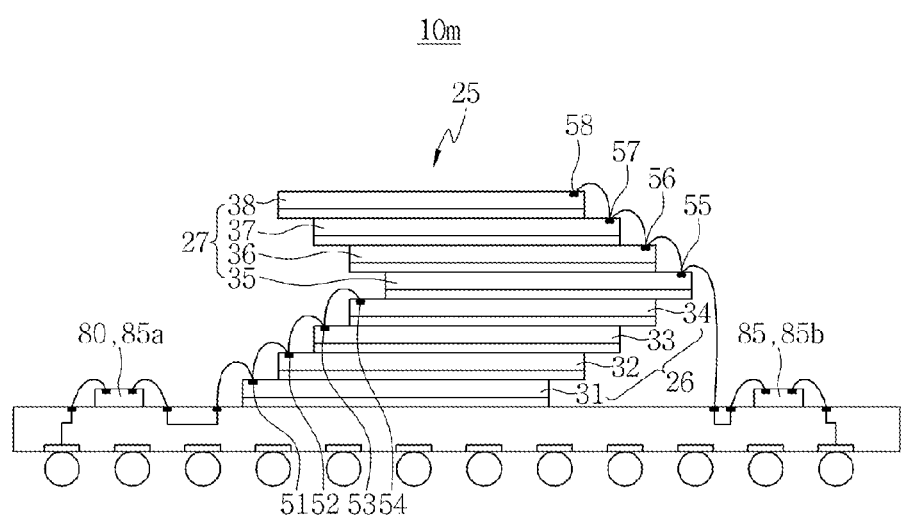

FIGS. 5A and 5B are a perspective view and a side view, respectively, schematically showing semiconductor packages in accordance with various embodiments of the inventive concept.

Referring to FIGS. 5A and 5B, the semiconductor package 10*m* in accordance with an embodiment may include a semiconductor stack structure 25 having a plurality of semiconductor devices 31 to 38 stacked in a form of a bi-directional cascade. For example, the semiconductor stack structure 25 may include a lower stack structure 26 in which first to fourth semiconductor devices 31 to 34 are stacked in cascade in a first horizontal direction D1, and an upper stack structure 27 in which fifth to eighth semiconductor devices 35 to 38 are stacked in cascade in a second horizontal direction D2 on the lower stack structure 26. The first horizontal direction D1 and the second horizontal direction D2 may be horizontally opposite directions from each other. Accordingly, chip pads 51 to 54 of the first to fourth semiconductor devices 31 to 34 in the lower stack structure 26, and chip pads 55 to 58 of the fifth to eighth semiconductor devices 35 to 38 in the upper stack structure 27 may be arranged to be opposite from each other. The chip pads 51 to 54 of the first to fourth semiconductor devices 31 to 34 in the lower stack structure 26 and the chip pads 55 to 58 of the fifth to eighth semiconductor devices 35 to 38 in the upper stack structure 27 may be arranged in the relation of point symmetry to each other.

Referring further to FIG. 5B, the semiconductor package 10*m* in accordance with an embodiment may include a control device 80 and a single buffering device (e.g., 85). In other embodiments, the semiconductor package 10*m* may include two buffering devices (e.g., 85*a* and 85*b*). For example, the semiconductor package 10*m* may include a first buffering device 85*a* arranged adjacent to the chip pads 51 to 54 of the first to fourth semiconductor devices 31 to 34 in the lower stack structure 26, and a second buffering device 85*b* arranged adjacent to the chip pads 55 to 58 of the fifth to eighth semiconductor devices 35 to 38 in the upper stack structure 27. Electrical connections of the control device 80 and/or the buffering devices 85, 85*a*, and 85*b* may be understood with reference to the drawings attached to the specification.

Referring back to FIGS. 2D and 2E, the control device 80 and/or the buffering devices 85, 85*a*, and 85*b* (of FIGS. 5A and 5B) may be arranged adjacent to the short edges of the semiconductor stack structure 20.

Figure 6A:
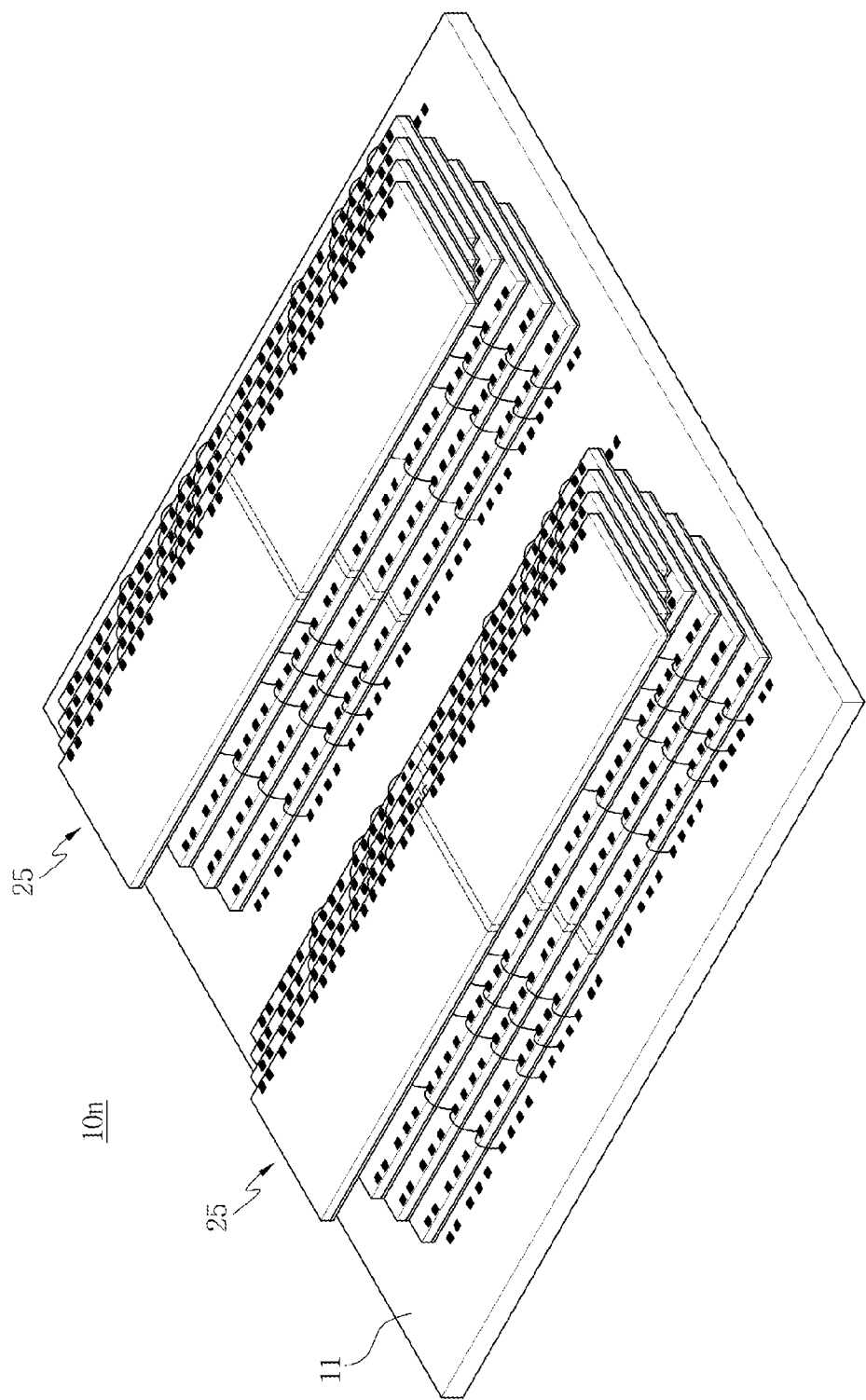
FIGS. 6A to 6C are first to third perspective views, respectively, schematically showing semiconductor packages in accordance with various embodiments of the inventive concept.
Figure 6B:
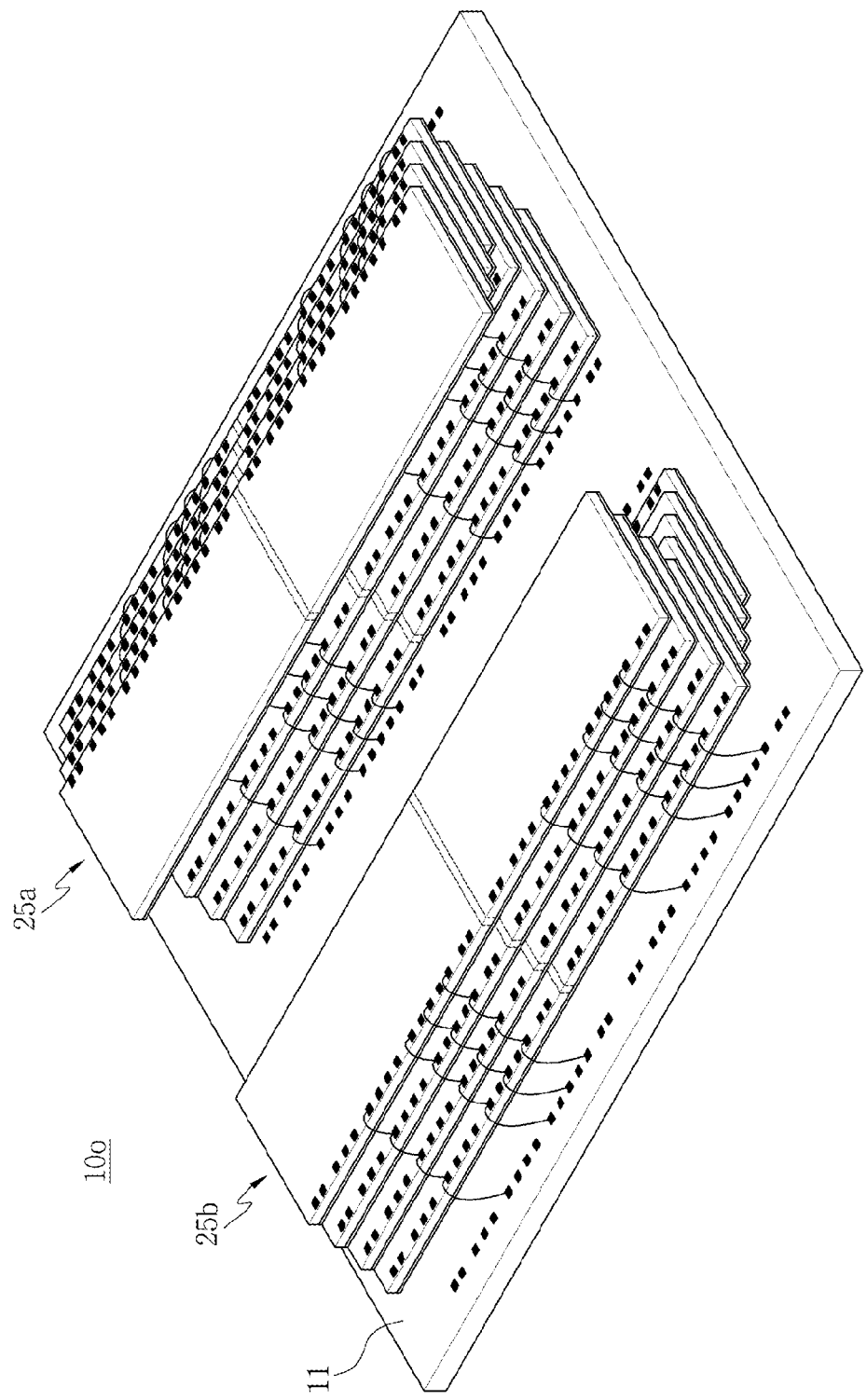
Figure 6C:
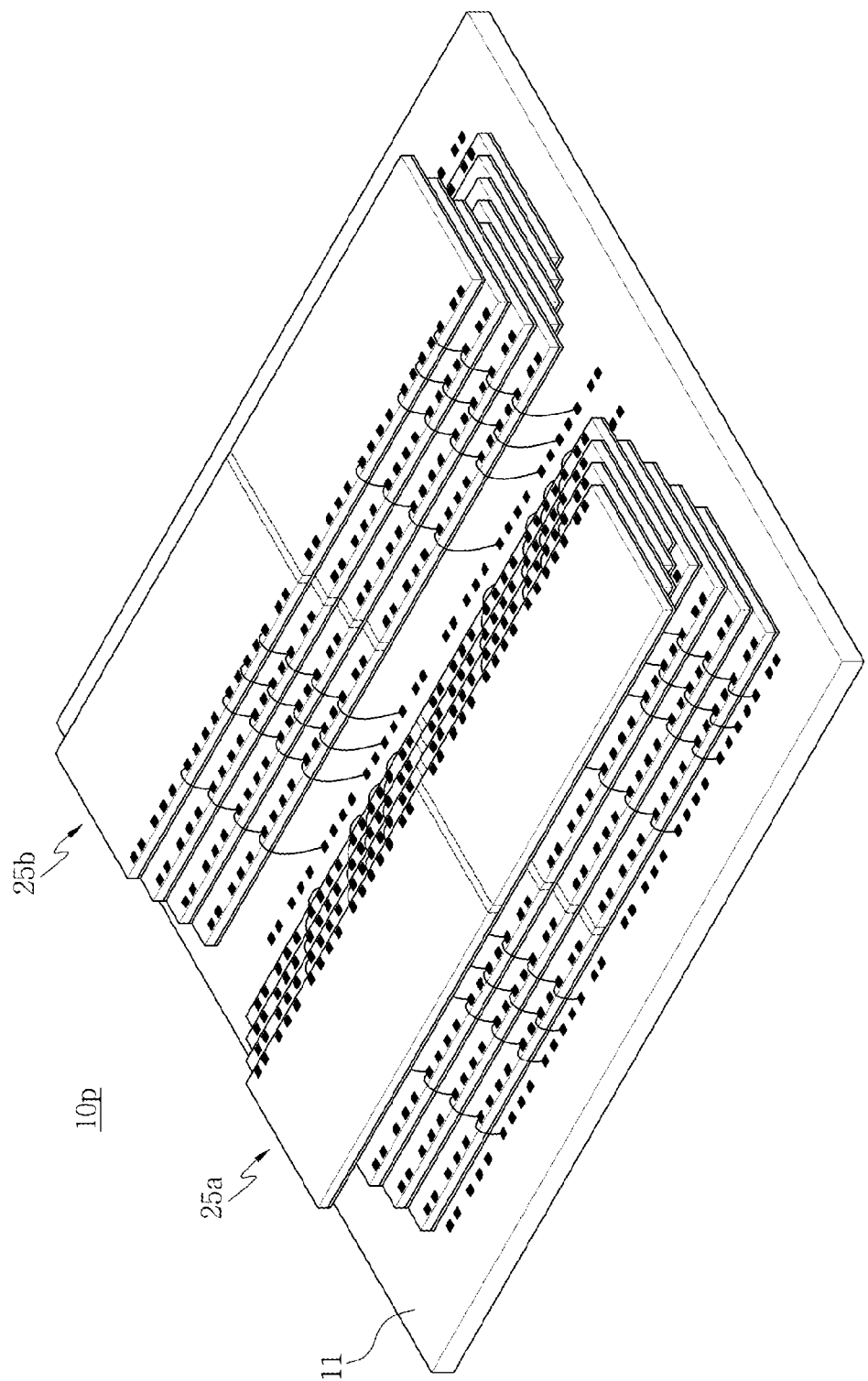

FIGS. 6A to 6C are schematic perspective views of semiconductor packages 10*n* to 10*p* in accordance with embodiments of the inventive concept. Referring to FIG. 6A, the semiconductor package 10*n* in accordance with an embodiment may include two semiconductor stack structures 25 arranged in parallel on a package board 11. The semiconductor stack structures 25 may be structurally the same as each other, and oriented and stacked in the same direction. Referring to FIG. 6B, the semiconductor package 10*o* in accordance with an embodiment may include a first semiconductor stack structure 25*a* and a second semiconductor stack structure 25*b*, which are stacked to face each other. The semiconductor stack structures 25*a* and 25*b* may be structurally the same as each other, but oriented and stacked to face opposite directions from each other. Referring further to FIG. 6C, the semiconductor package 10*p* in accordance with an embodiment may include a first semiconductor stack structure 25*a* and a second semiconductor stack structure 25*b* which are oriented and stacked to face opposite directions from each other. Each of the semiconductor stack structures 25, 25*a*, and 25*b* may be understood with further reference to FIGS. 5A and 5B. Referring to other drawings of this specification, the semiconductor packages 10*n* to 10*p* may further include a control device 80 and/or buffering devices 85, 85*a*, and 85*b* which can be arranged in various locations, as described in detail above. In other embodiments, the control device 80 and/or the buffering devices 85, 85*a*, and 85*b* may be arranged between the first semiconductor stack structure 25*a* and the second semiconductor stack structure 25*b*.

FIGS. 7A to 7D are schematic perspective views of semiconductor packages 10*q* to 10*t* in accordance with embodiments of the inventive concept.

Figure 7A:
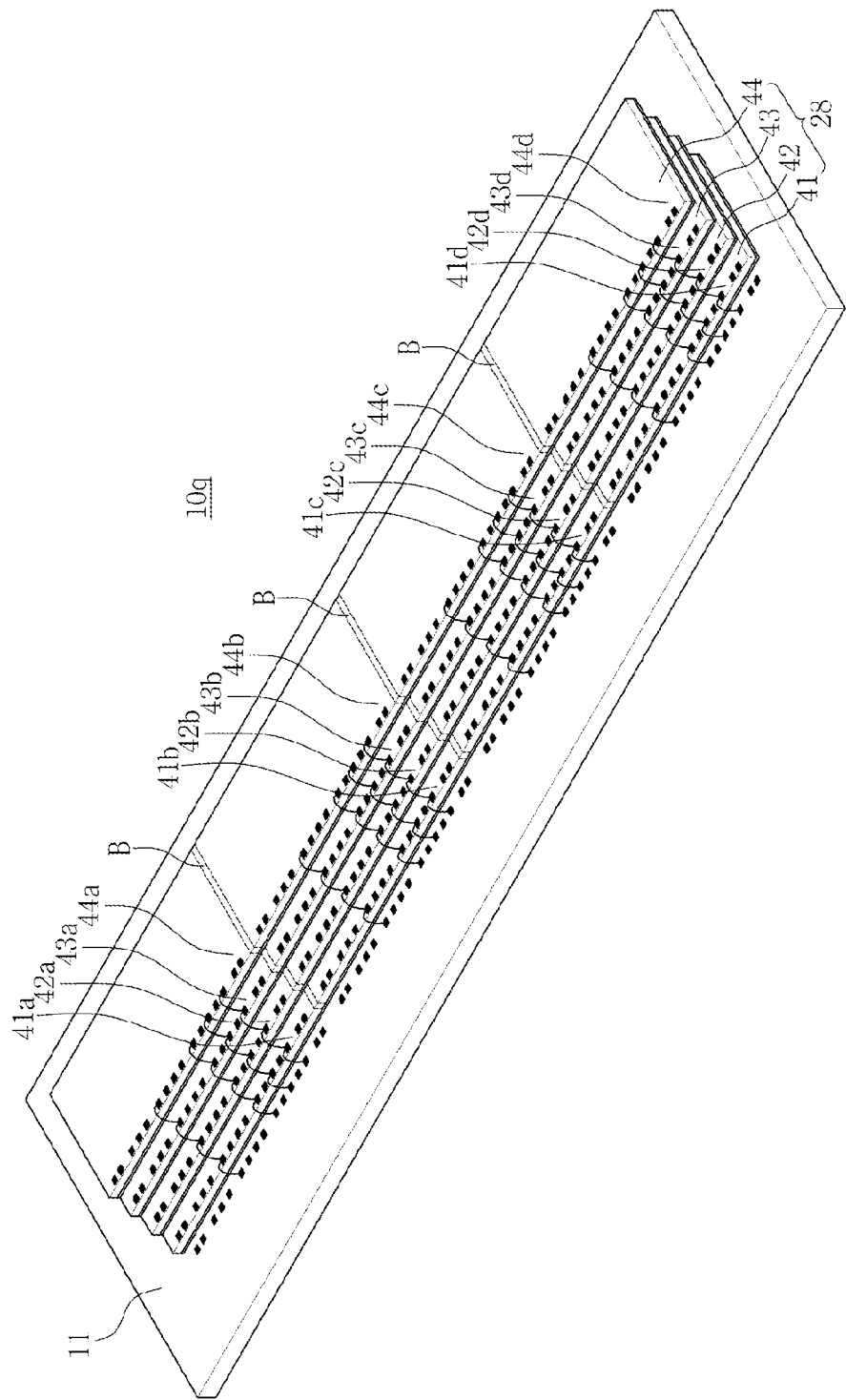
FIGS. 7A to 7D are first to fourth perspective views, respectively, schematically showing semiconductor packages in accordance with various embodiments of the inventive concept.

Referring to FIG. 7A, the semiconductor package 10*q* in accordance with an embodiment may include a semiconductor stack structure 28 having a plurality of semiconductor devices 41 to 44 stacked in forms of a unidirectional cascade on a package board 11. Each of the semiconductor devices 41 to 44 may include first to fourth unit semiconductor devices 41*a* to 41*d*, 42*a* to 42*d*, 43*a* to 43*d*, and 44*a* to 44*d*. Boundary regions B may exist between the unit semiconductor devices 41*a* to 41*d*, 42*a* to 42*d*, 43*a* to 43*d*, and 44*a* to 44*d*. The semiconductor devices 41 to 44 or the first to fourth unit semiconductor chips 41*a* to 41*d*, 42*a* to 42*d*, 43*a* to 43*d*, and 44*a* to 44*d* may be structurally the same as each other. The inventive concept described with reference to other drawings of this specification may be extended and applied to this embodiment.

Figure 7B:
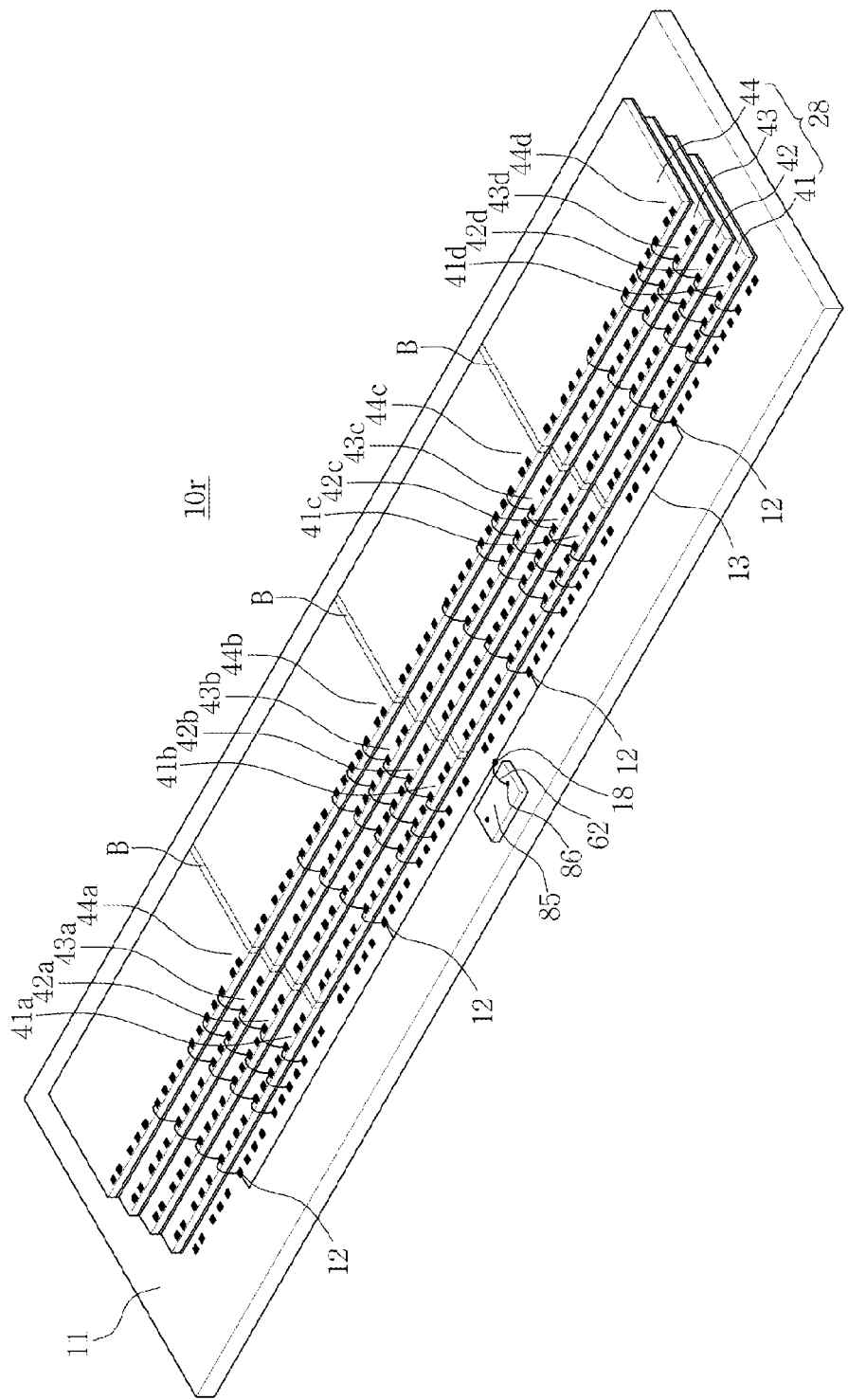

Referring to FIG. 7B, the semiconductor package 10*r* in accordance with an embodiment of the inventive concept may include a common buffering device 85. The common buffering device 85 may be electrically connected to all of the unit semiconductor chips 41*a* to 41*d*, 42*a* to 42*d*, 43*a* to 43*d*, and 44*a* to 44*d*. A description of the buffering pad 86, buffering wire 62, buffering board pad 18, board wire 13, and board pads 12 is provided above and is therefore not repeated.

Figure 7C:
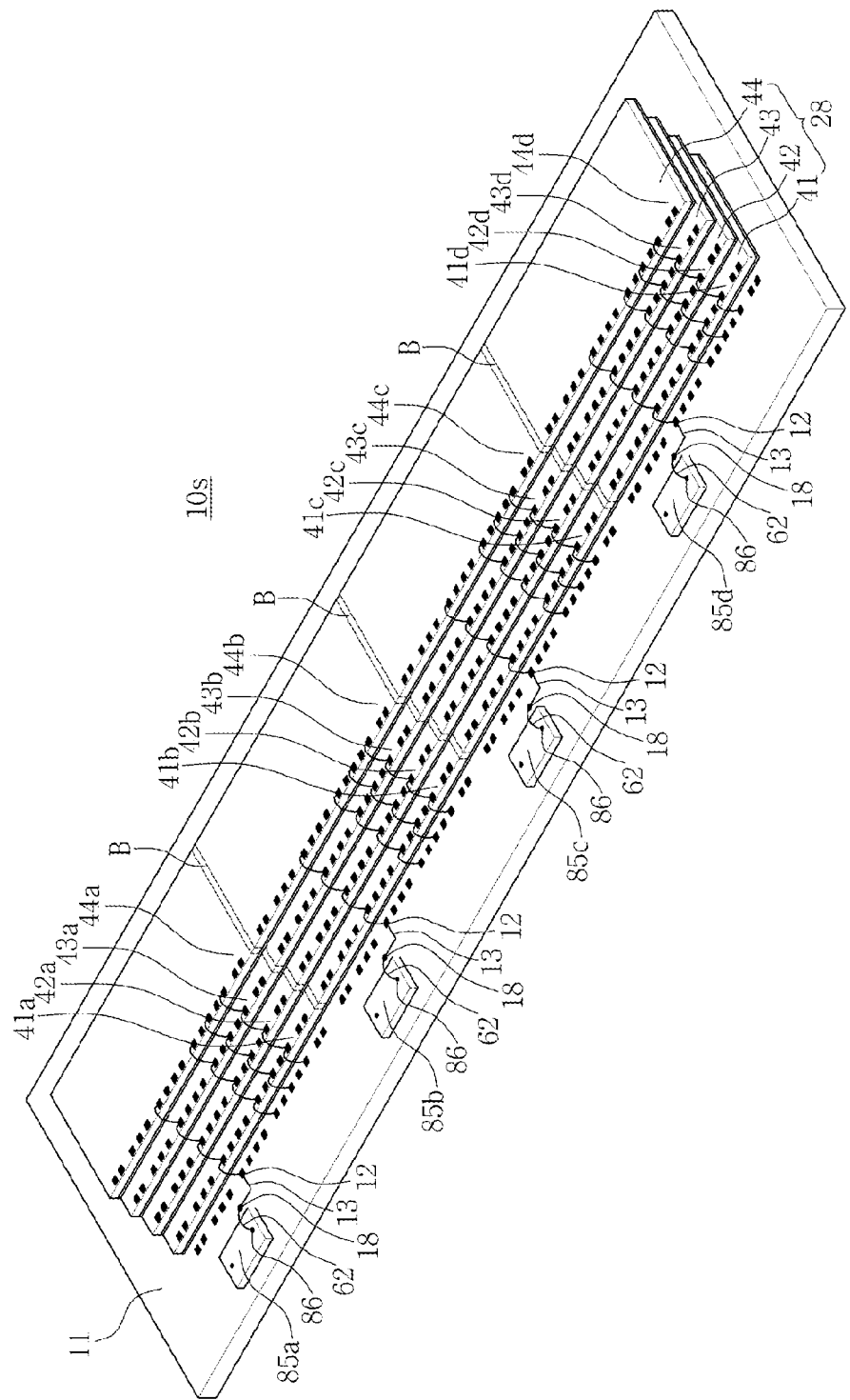

Referring to FIG. 7C, the semiconductor package 10*s* in accordance with an embodiment may include individual buffering devices 85*a* to 85*d*. Each of the individual buffering devices 85*a* to 85*d* may be electrically connected to unit semiconductor chips 41*a* to 44*a*, 41*b* to 44*b*, 41*c* to 44*c*, and 41*d* to 44*d*, respectively, and independently. For example, the first buffering device 85*a* may be electrically connected to the first unit semiconductor chips 41*a*, 42*a*, 43*a*, and 44*a*, the second buffering device 85*b* may be electrically connected to the second unit semiconductor chips 41*b*, 42*b*, 43*b*, and 44*b*, the third buffering device 85*c* may be electrically connected to the third unit semiconductor chips 41*c*, 42*c*, 43*c*, and 44*c*, and the fourth buffering device 85*d* may be electrically connected to the fourth unit semiconductor chips 41*d*, 42*d*, 43*d*, and 44*d*. A description of the buffering pad 86, buffering wire 62, buffering board pad 18, board wire 13, and board pads 12 is provided above and is therefore not repeated.

Figure 7D:
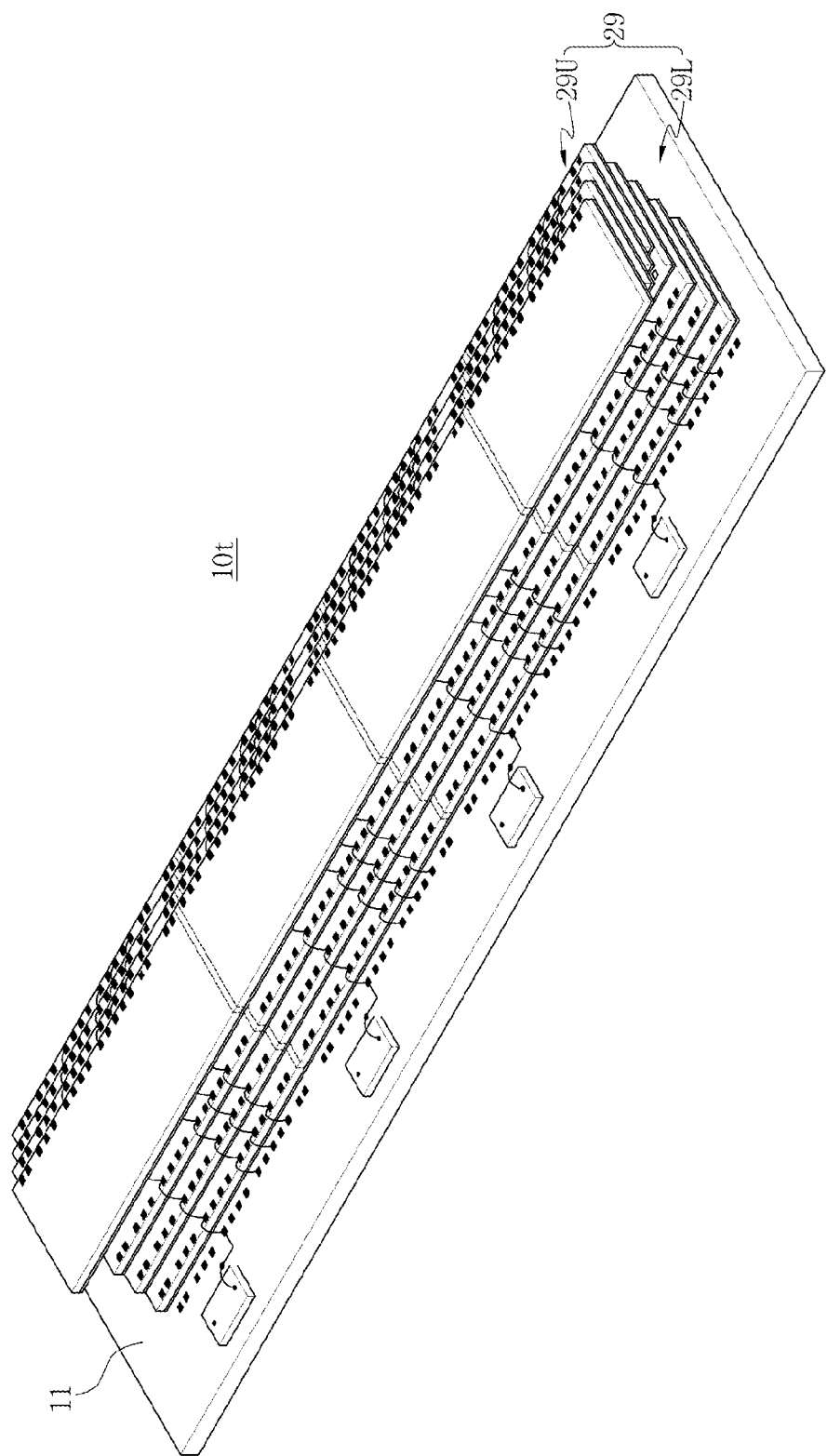

Referring to FIG. 7D, the semiconductor package 10*t* in accordance with an embodiment may include a lower stack structure 29L and an upper stack structure 29U which are stacked in a form of a bi-directional cascade on a package board 11. The various embodiments of the inventive concept described with reference to other drawings of this specification may be further applied to the semiconductor package 10t of this embodiment.

Figure 8A:
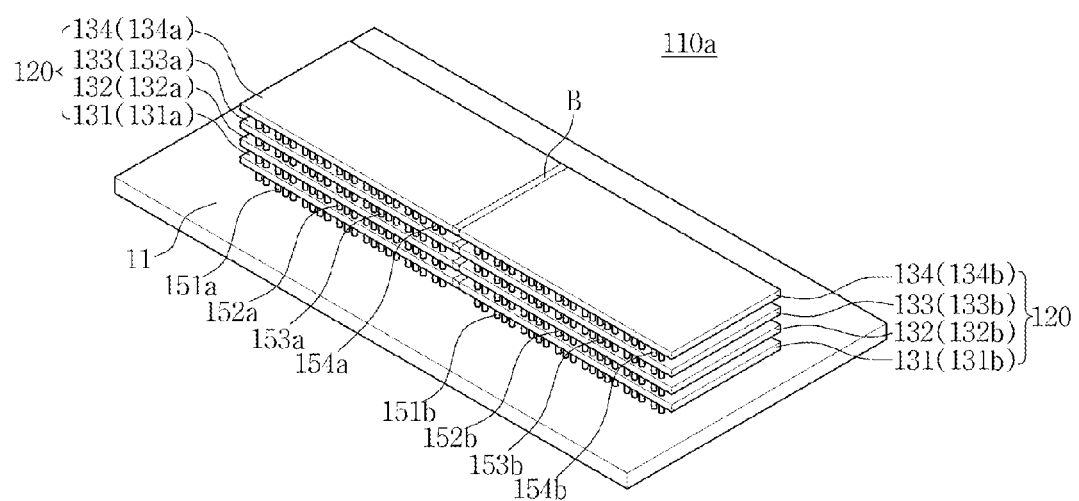
FIGS. 8A to 8C are first to third perspective views, respectively, schematically showing semiconductor packages in accordance with various embodiments of the inventive concept.
Figure 8B:
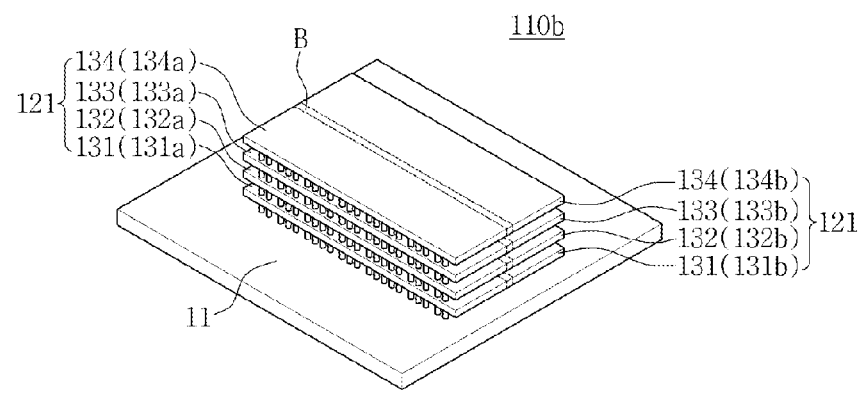
Figure 8C:
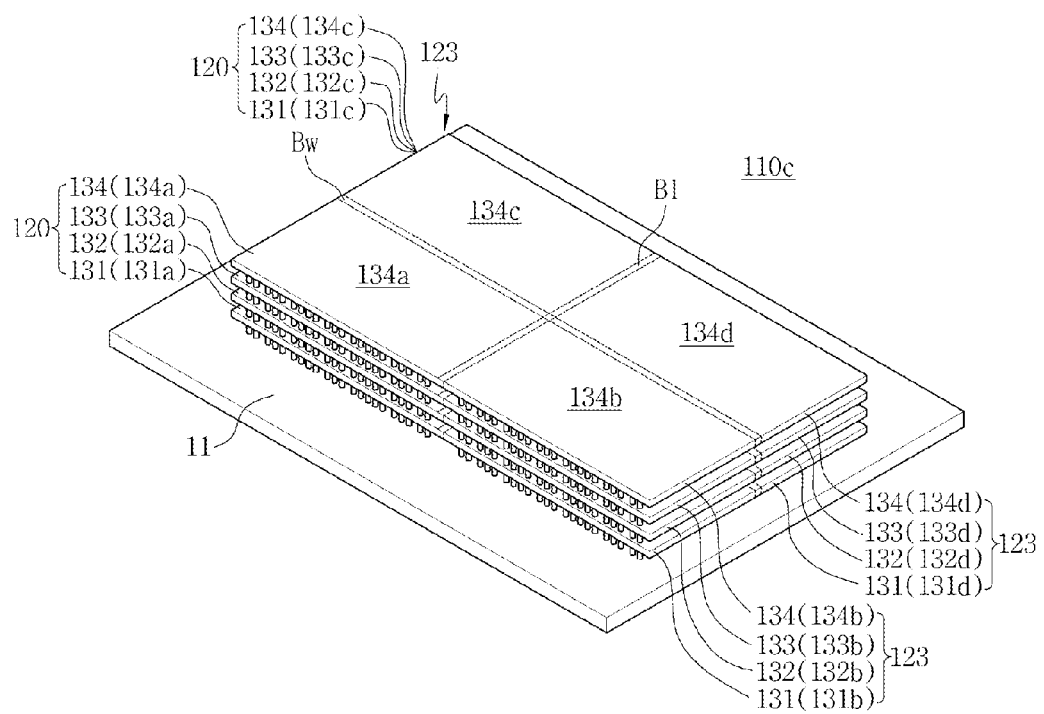

FIGS. 8A to 8C are perspective views schematically showing semiconductor packages 110a to 110c in accordance with embodiments of the inventive concept.

Referring to FIGS. 8A and 8B, the semiconductor packages 110a and 110b in accordance with embodiments may include semiconductor stack structures 120 and 121 having a plurality of stacked semiconductor devices 131 to 134 of which sides are vertically aligned on a package board 11. Each of the semiconductor devices 131 to 134 may include at least two pairs of unit semiconductor chips 131a/131b, 132a/132b, 133a/133b, and 134a/134b. Boundary regions B may exist between the pairs of unit semiconductor chips 131a/131b, 132a/132b, 133a/133b, and 134a/134b. The semiconductor devices 131 to 134 or the pairs of unit semiconductor chips 131a/131b, 132a/132b, 133a/133b, and 134a/134b may be vertically electrically connected to each other using pairs of inter-chip bumps 151a/151b, 152a/152b, 153a/153b, and 154a/154b. The pairs of inter-chip bumps 151a/151b, 152a/152b, 153a/153b, and 154a/154b may have the same array at each layer. In other embodiments, the pairs of inter-chip bumps 151a/151b, 152a/152b, 153a/153b, and 154a/154b may have arrays in symmetry with respect to the boundary regions B.

Referring further to FIG. 8A, the semiconductor stack structure 120 may include semiconductor devices 131 to 134. Each of semiconductor devices 131 to 134 may include a pair of unit semiconductor chips (e.g., 131a/131b, 132a/132b, 133a/133b, and 134a/134b), each of the unit semiconductor chips of the pair having short edges thereof adjacent to each other. In other words, boundary regions B may exist between the adjacent short edges of each pair of unit semiconductor chips 131a/131b, 132a/132b, 133a/133b, and 134a/134b.

Referring further to FIG. 8B, the semiconductor stack structure 121 may include semiconductor devices 131 to 134, each of which includes a pair of unit semiconductor chips 131a/131b, 132a/132b, 133a/133b, and 134a/134b adjacent to each other at the long edges. For example, boundary regions B may exist between the adjacent long edges of each pair of unit semiconductor chips 131a/131b, 132a/132b, 133a/133b, and 134a/134b.

Referring to FIG. 8C, the semiconductor package 110c in accordance with an embodiment may include a semiconductor stack structure 123 having a plurality of stacked semiconductor devices 131 to 134 of which sides are vertically aligned. Each of the semiconductor devices 131 to 134 may include a group of four unit semiconductor chips (e.g., 131a-131d, 132a-132d, 133a-133d, and 134a-134d) arranged in a form of four quadrants. It will be understood that unit semiconductor chips 131c, 132c, and 133c exist but are hidden in this view under unit semiconductor chip 134c. Vertical boundary regions Bl and horizontal boundary regions Bw may exist between the unit semiconductor chips 131a-131d, 132a-132d, 133a-133d, and 134a-134d.

As described above, the boundary regions B, Bl, and Bw may correspond to scribe lanes in a state of a wafer. Accordingly, for example, the boundary regions B, Bl, and Bw may include a test element group (TEG) or alignment keys.

FIGS. 9A to 9D are side views schematically showing semiconductor packages 110d to 110f in accordance with embodiments of the inventive concept.

Figure 9A:
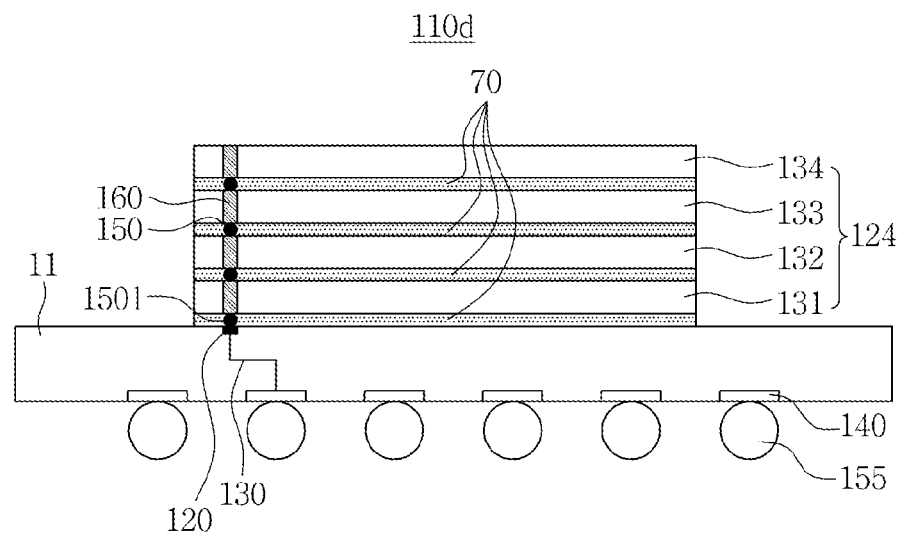
FIGS. 9A to 9D are first to fourth side views, respectively, schematically showing semiconductor packages in accordance with various embodiments of the inventive concept.

Referring to FIG. 9A, the semiconductor package 110d in accordance with an embodiment may include a semiconductor stack structure 124 having inter-chip bumps 150 arranged adjacent to an edge of semiconductor devices 131 to 134 or an edge of unit semiconductor chips 131a-131d, 132a-132d, 133a-133d, and 134a-134d, with further reference to the semiconductor package 110a described in FIG. 8A. The semiconductor devices 131-134 may include through-vias 160. For example, the inter-chip bumps 150 and the through-vias 160 may be vertically electrically connected in series. A filler 70 such as an underfill material, a molding material, or a die attach film may be formed between the package board 11 and the lowermost semiconductor device 131, and between the semiconductor devices 132 to 134. The lowermost semiconductor device 131 may be electrically connected to a board pad 120 through the lowermost inter-chip bump 150l. The board pad 120 may be electrically connected to one or more bump pads (e.g., 140) and one or more package bumps (e.g., 155) through one or more board wires (e.g., 130).

Figure 9B:
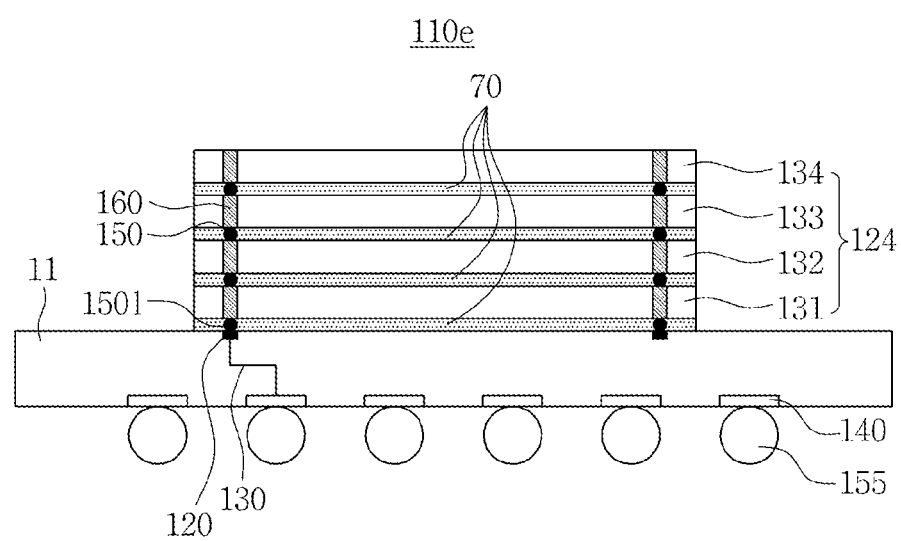

Referring to FIG. 9B, the semiconductor package 110e in accordance with an embodiment may include a semiconductor stack structure 124 having inter-chip bumps 150 arranged at or toward two opposite edges of semiconductor devices 131 to 134, with further reference to the semiconductor package 110b described in FIG. 8A.

Figure 9C:
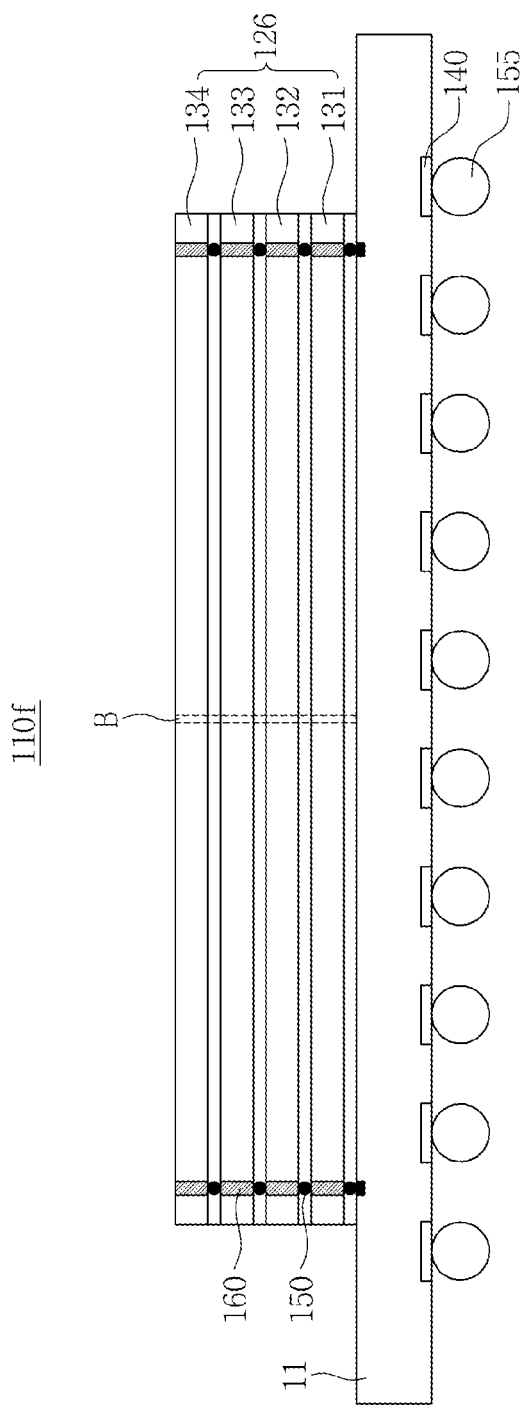

Referring to FIG. 9C, the semiconductor package 110f in accordance with an embodiment may include a semiconductor stack structure 126 having inter-chip bumps 150 arranged adjacent to opposite edges of semiconductor devices 131 to 134, or at an edge of each unit semiconductor chip 131a-131d, 132a-132d, 133a-133d, and 134a-134d, with further reference to the semiconductor packages 110a to 110c described in FIGS. 8A to 8C. Boundary regions B may exist between the unit semiconductor chips 131a-131d, 132a-132d, 133a-133d, and 134a-134d. For example, the inter-chip bumps 150 may not be arranged adjacent to the boundary regions B.

Figure 9D:
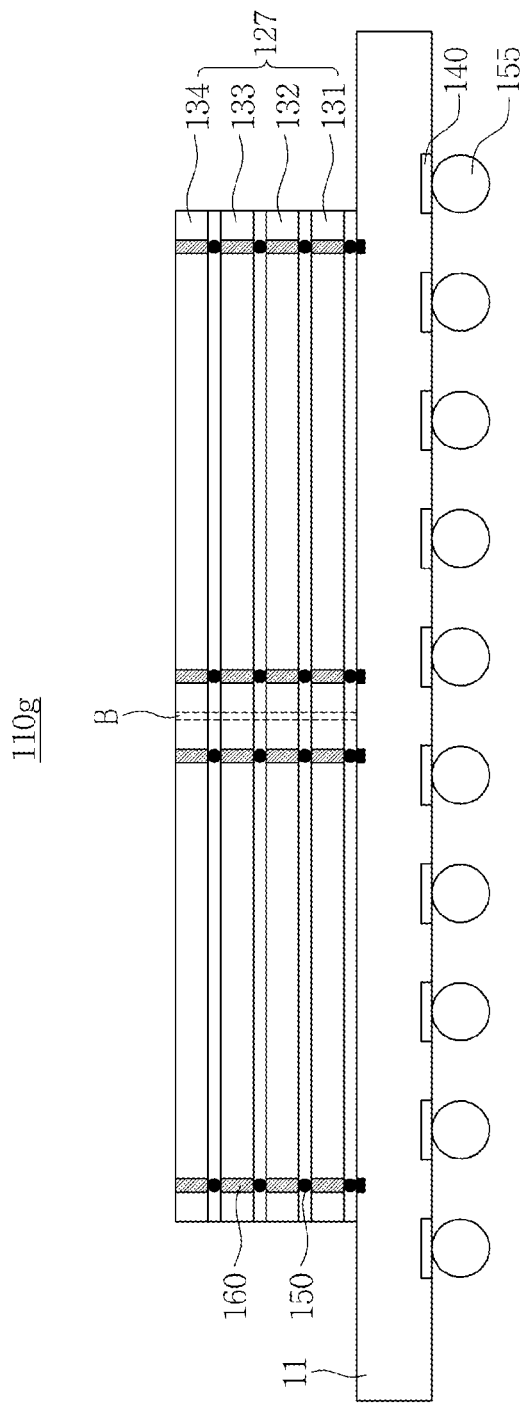

Referring to FIG. 9D, the semiconductor package 110g in accordance with an embodiment may include a semiconductor stack structure 127 having inter-chip bumps 150 arranged adjacent to two opposite edges of each unit semiconductor chip 131a-131d, 132a-132d, 133a-133d, and 134a-134d, with further reference to FIGS. 8A to 8C. For example, the inter-chip bumps 150 may also be arranged adjacent to the boundary regions B.

FIGS. 10A to 10H are views for schematically describing a method of fabricating a semiconductor package in accordance with an embodiment of the inventive concept.

Figure 10A:
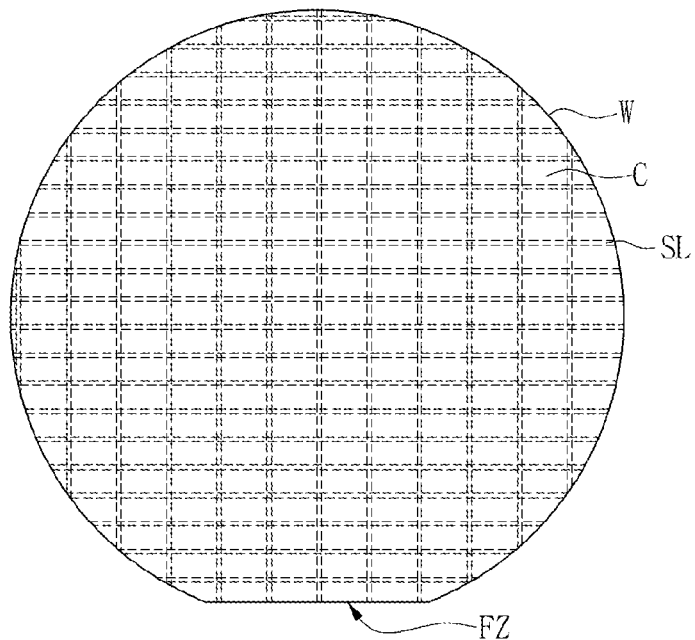
FIGS. 10A to 10H and FIGS. 11A to 11C are schematic views illustrating methods of fabricating semiconductor packages in accordance with embodiments of the inventive concept.

Referring to FIG. 10A, the method may include forming a plurality of pairs of unit semiconductor chips C on a wafer W. A scribe lane SL may be formed between the pairs of unit semiconductor chips C. A flat zone FZ may be formed in an outskirt region of the wafer W.

Figure 10B:
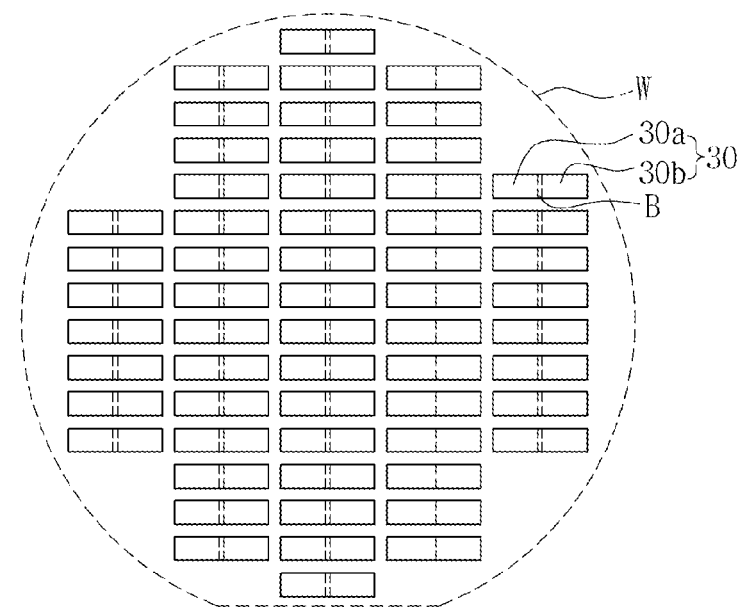

Referring to FIG. 10B, the method may include separating individual semiconductor devices 30 having at least two unit semiconductor chips 30a and 30b (i.e., a pair of unit semiconductor chips) by sawing the wafer W. A boundary region B may exist between the unit semiconductor chips 30a and 30b of the pair. Each pair of unit semiconductor chips (e.g., 30a and 30b) may be horizontally physically contiguous, as described above.

Figure 10C:
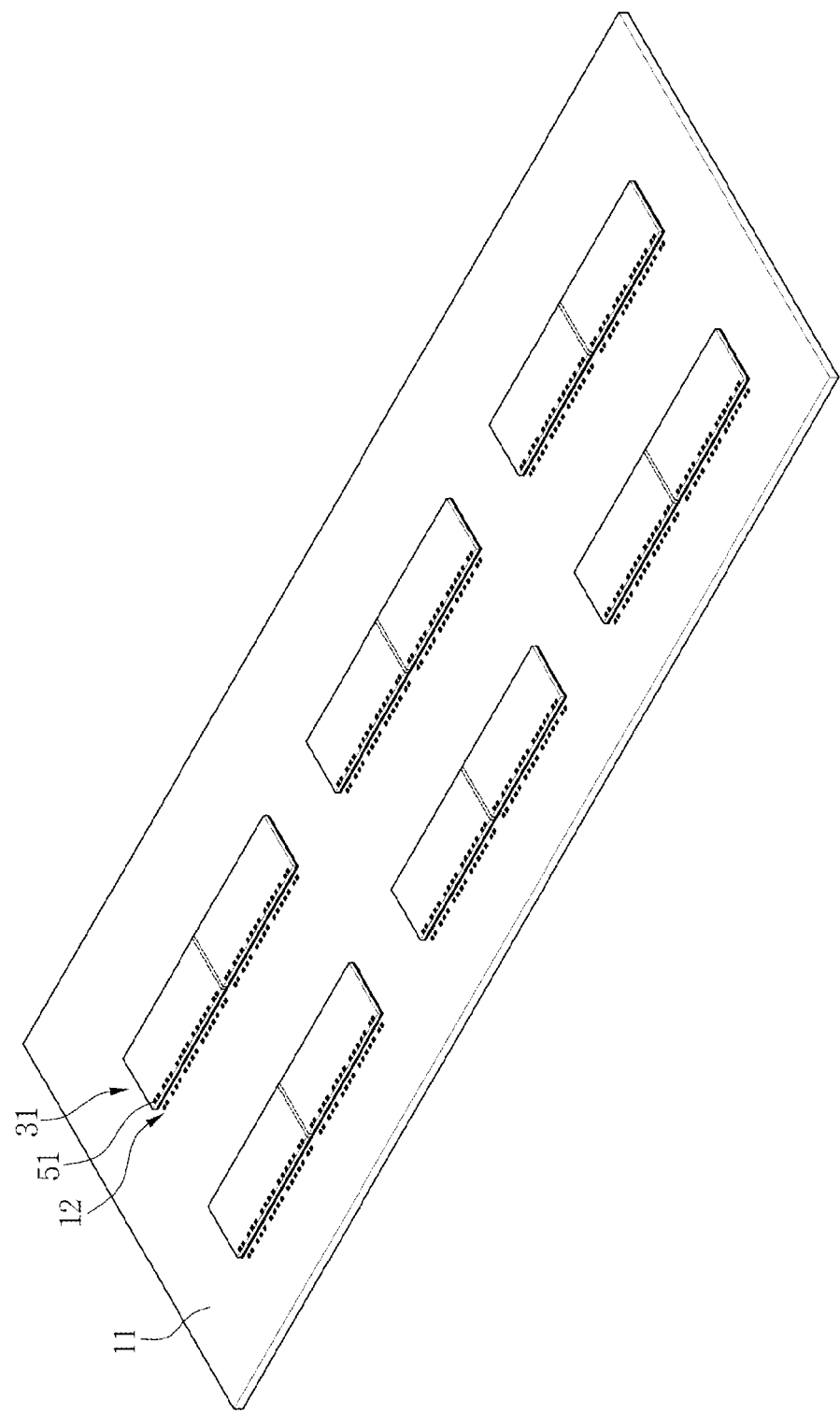

Referring to FIG. 10C, the method may include installing the lowermost semiconductor devices 31 on a package board 11. The lowermost semiconductor devices 31 may be parts of individual separated semiconductor devices 30. Board pads 12 on the package board 11 and chip pads 51 on surfaces of the lowermost semiconductor devices 31 may be arranged adjacent to each other.

Figure 10D:
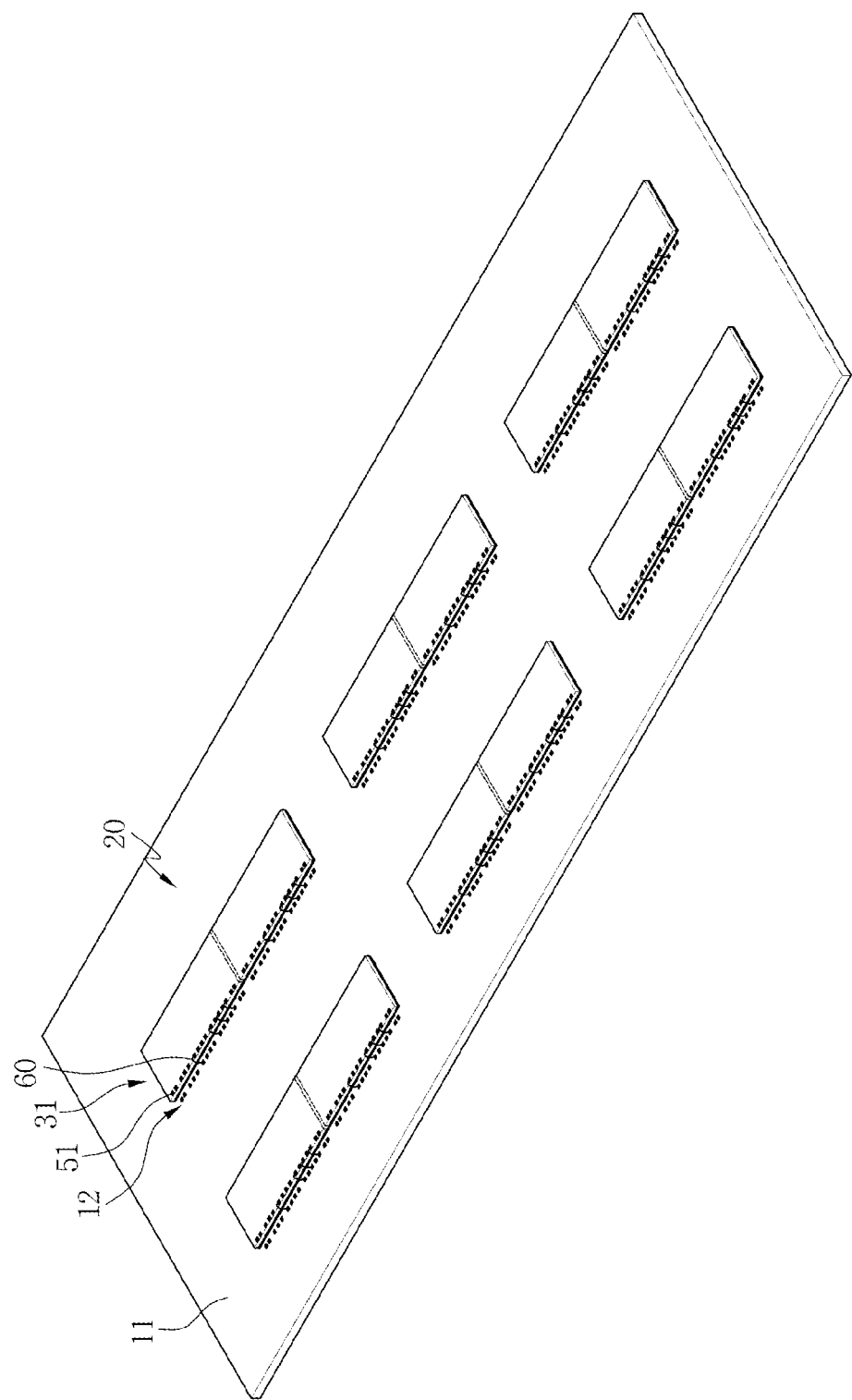

Referring to FIG. 10D, the method may include electrically connecting the board pads 12 of the package board 11 and the chip pads 51 of the lowermost semiconductor devices 31 through bonding wires 60.

Figure 10E:
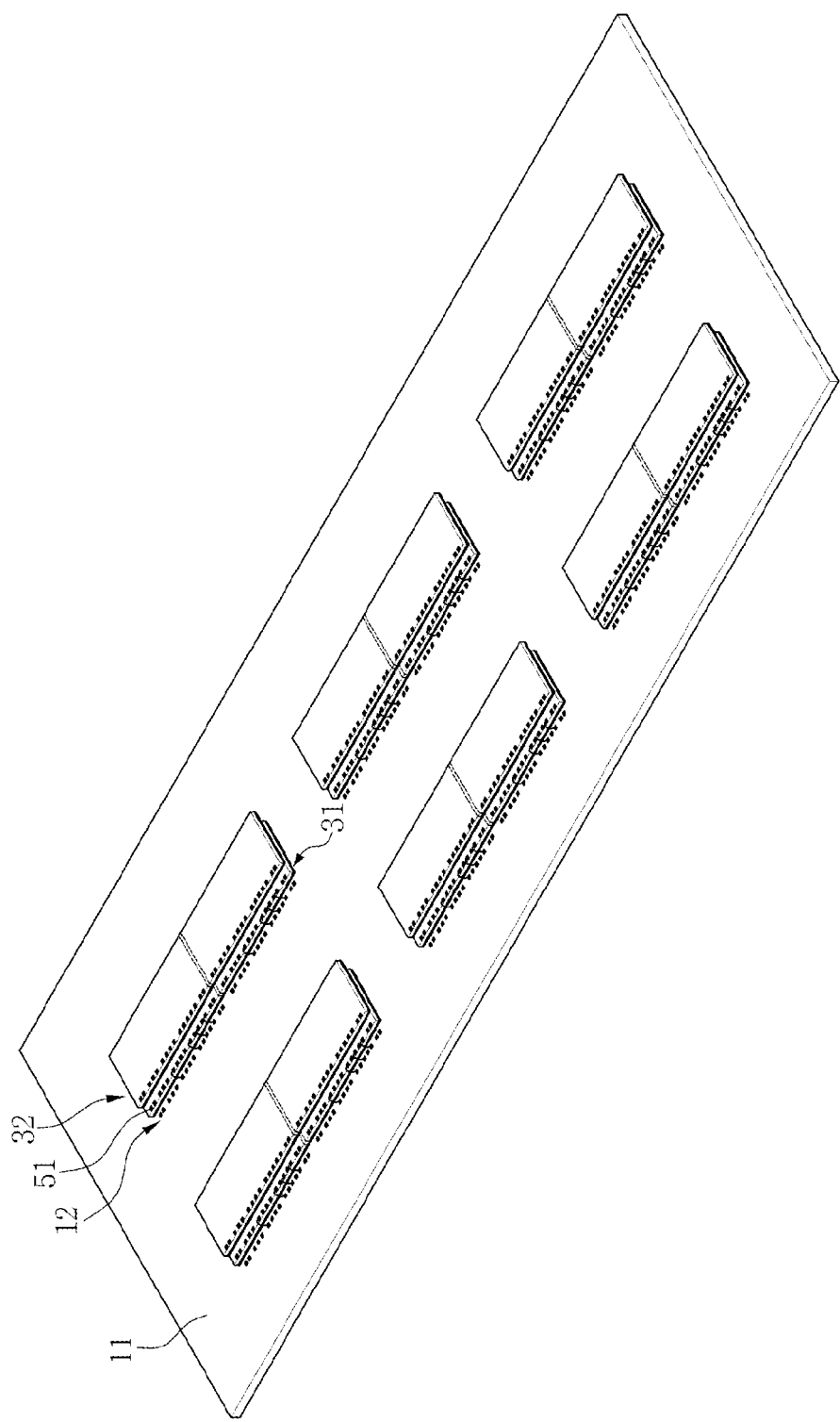

Referring to FIG. 10E, the method may include stacking first intermediate semiconductor devices 32 on the lowermost semiconductor devices 31.

Figure 10F:
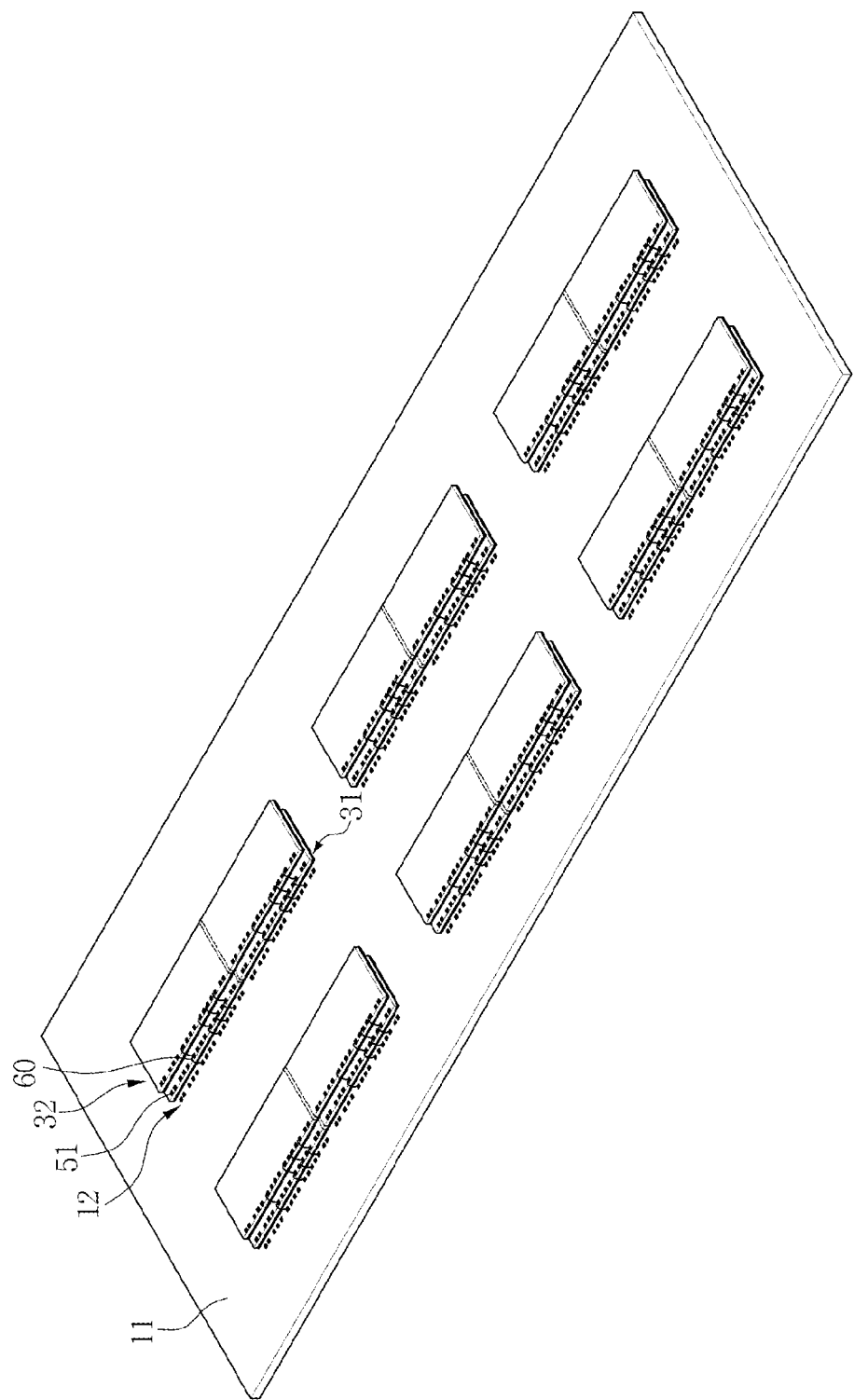

Referring to FIG. 10F, the method may include forming bonding wires 60 electrically connecting the lowermost semiconductor devices 31 and the first intermediate semiconductor devices 32.

Figure 10G:
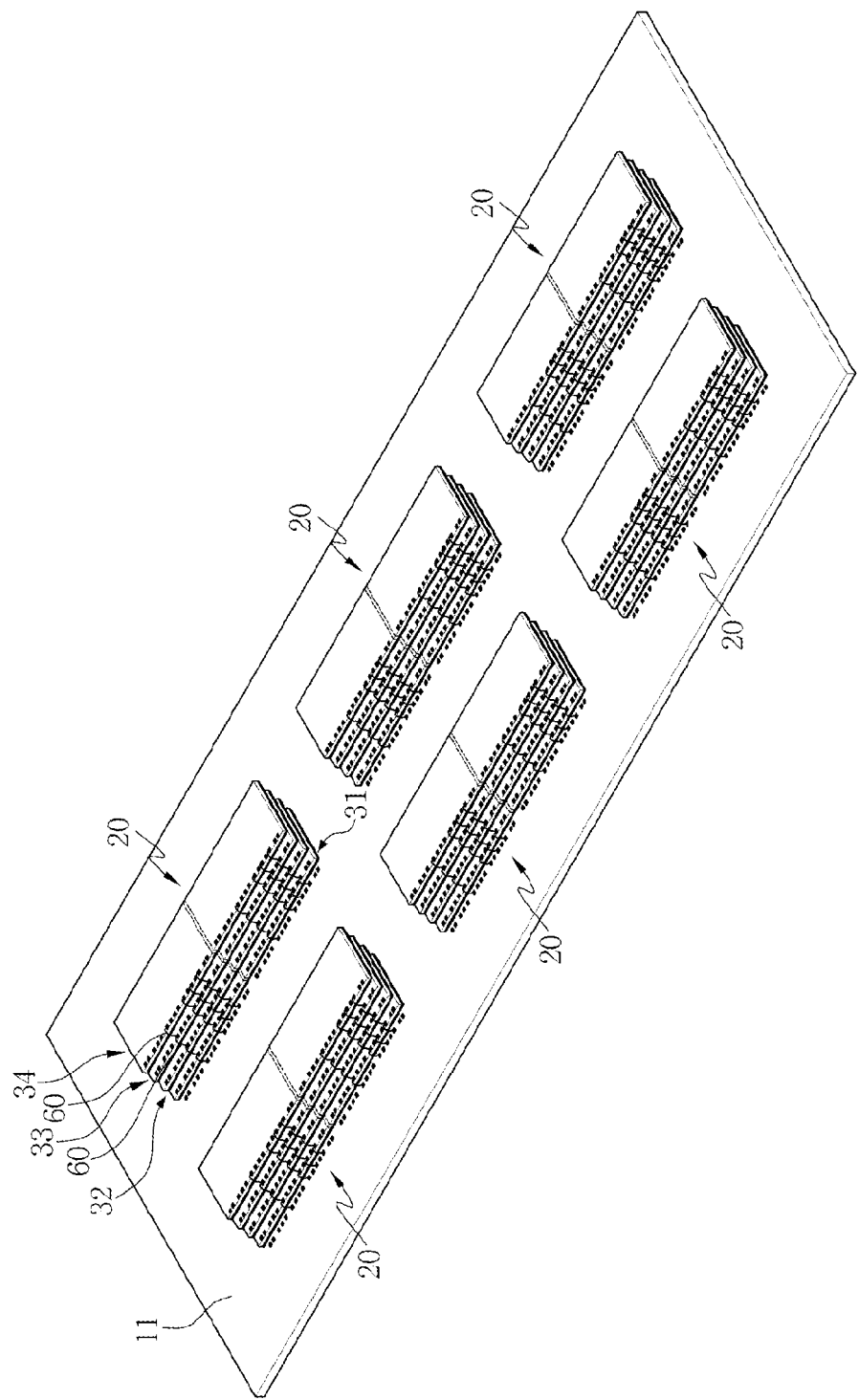

Referring to FIG. 10G, the method may include stacking second intermediate semiconductor devices 33 on the first intermediate semiconductor devices 32, forming bonding wires 60 electrically connecting the first intermediate semiconductor devices 32 and the second intermediate semiconductor devices 33, stacking the uppermost semiconductor devices 34 on the second intermediate semiconductor devices 33, and forming bonding wires 60 electrically connecting the second intermediate semiconductor devices 33 and the uppermost semiconductor devices 34. Semiconductor stack structures 20 may be formed by the above processes.

Figure 10H:
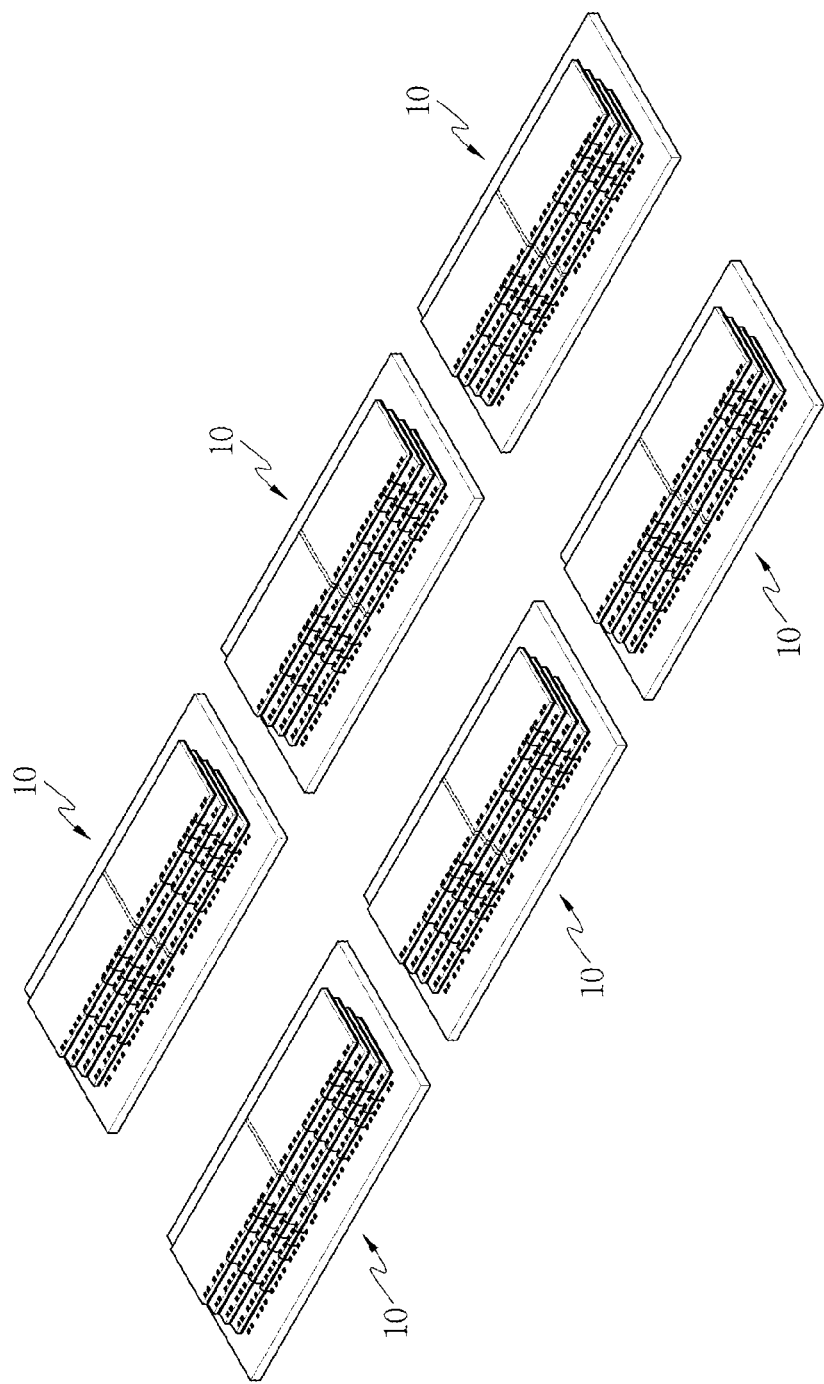

Referring to FIG. 10H, the method may include separating individual semiconductor packages 10 having one of the semiconductor stack structures 20 by sawing the package board 11. Before or after performing this process, a molding material covering the semiconductor stack structures 20 may be formed.

By performing the above processes, the semiconductor package 10a in accordance with an embodiment may be formed. Methods of fabricating the semiconductor packages 10b to 10t may be understood with reference to FIGS. 10A to 10H.

Figure 11A:
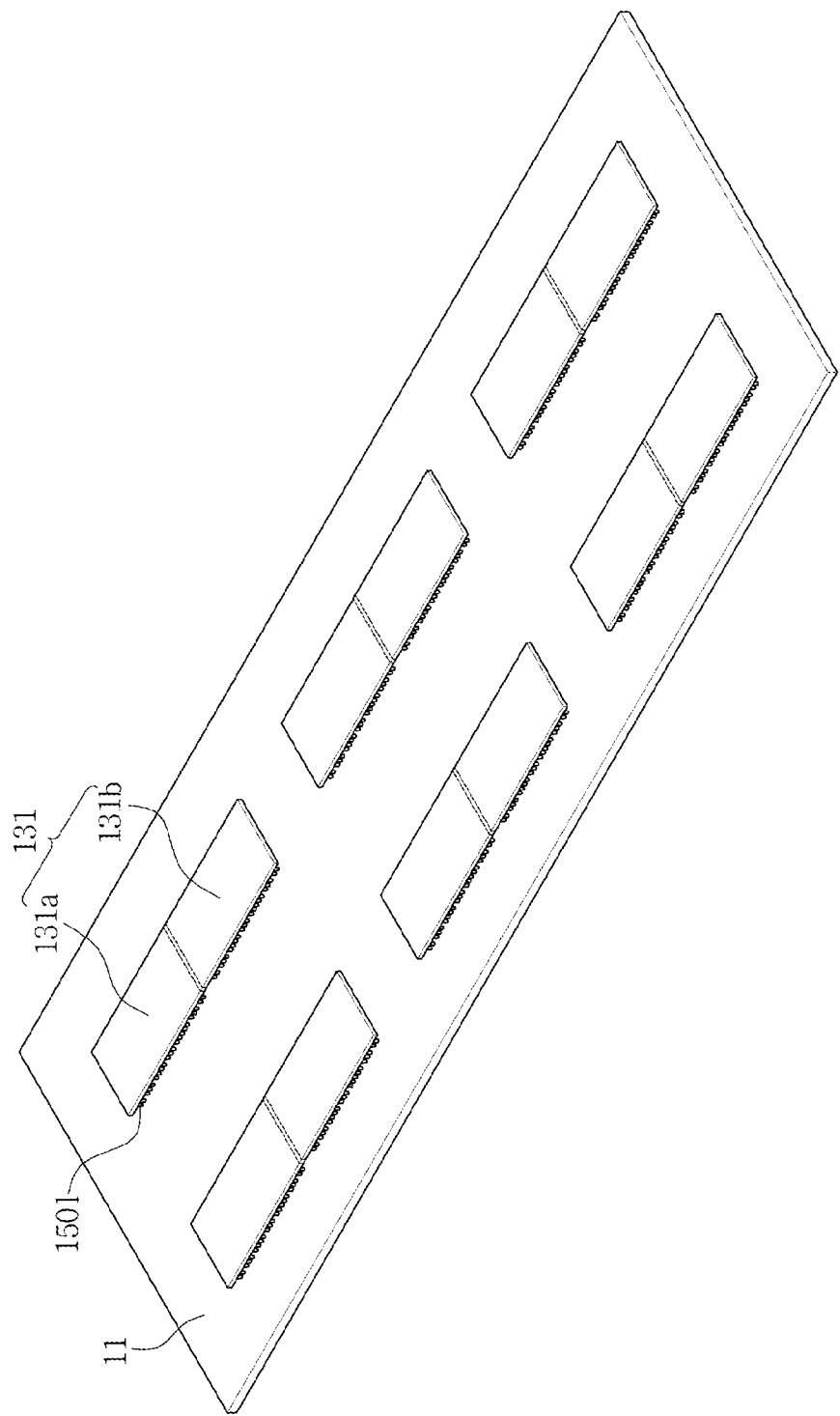
Figure 11B:
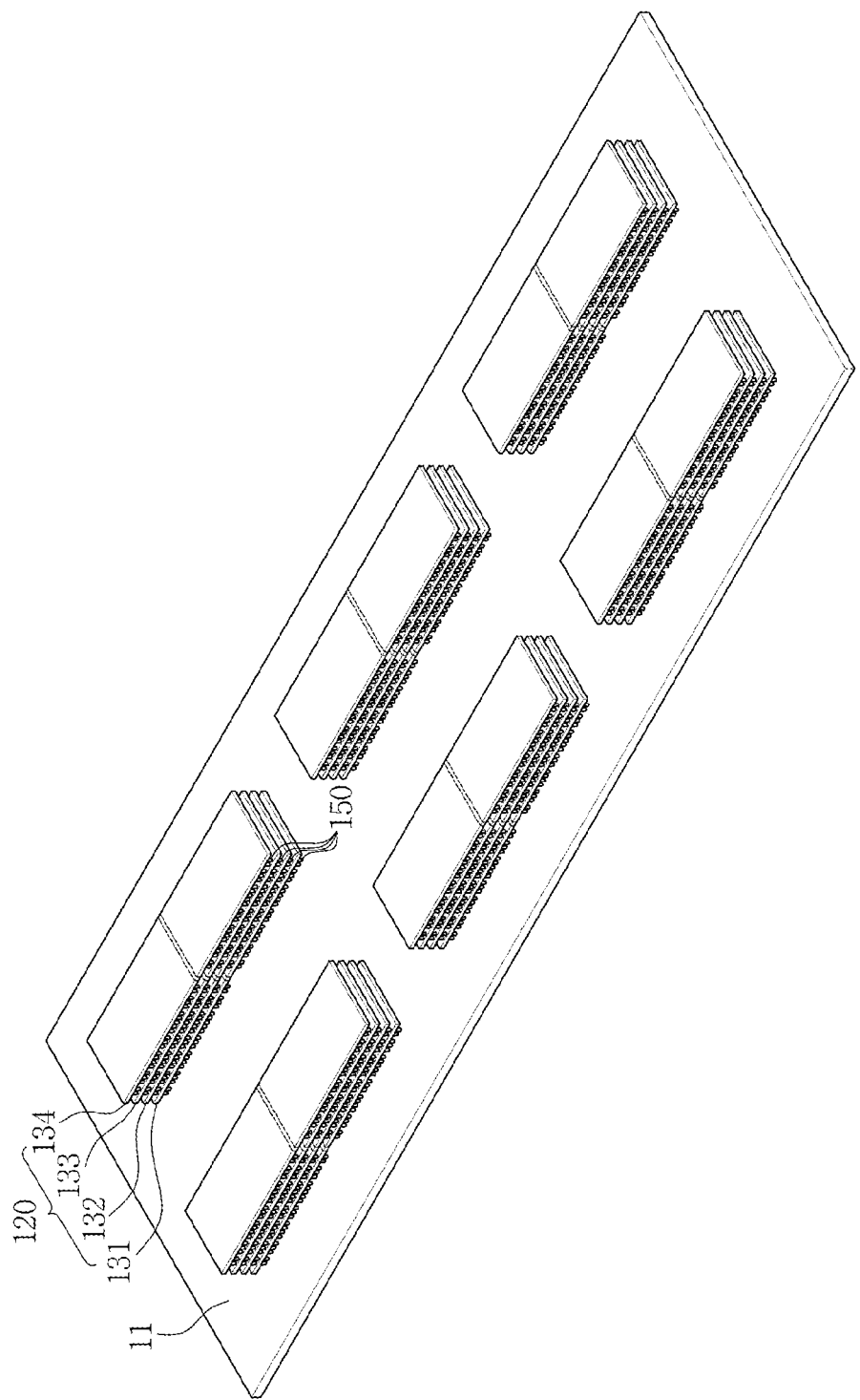
Figure 11C:
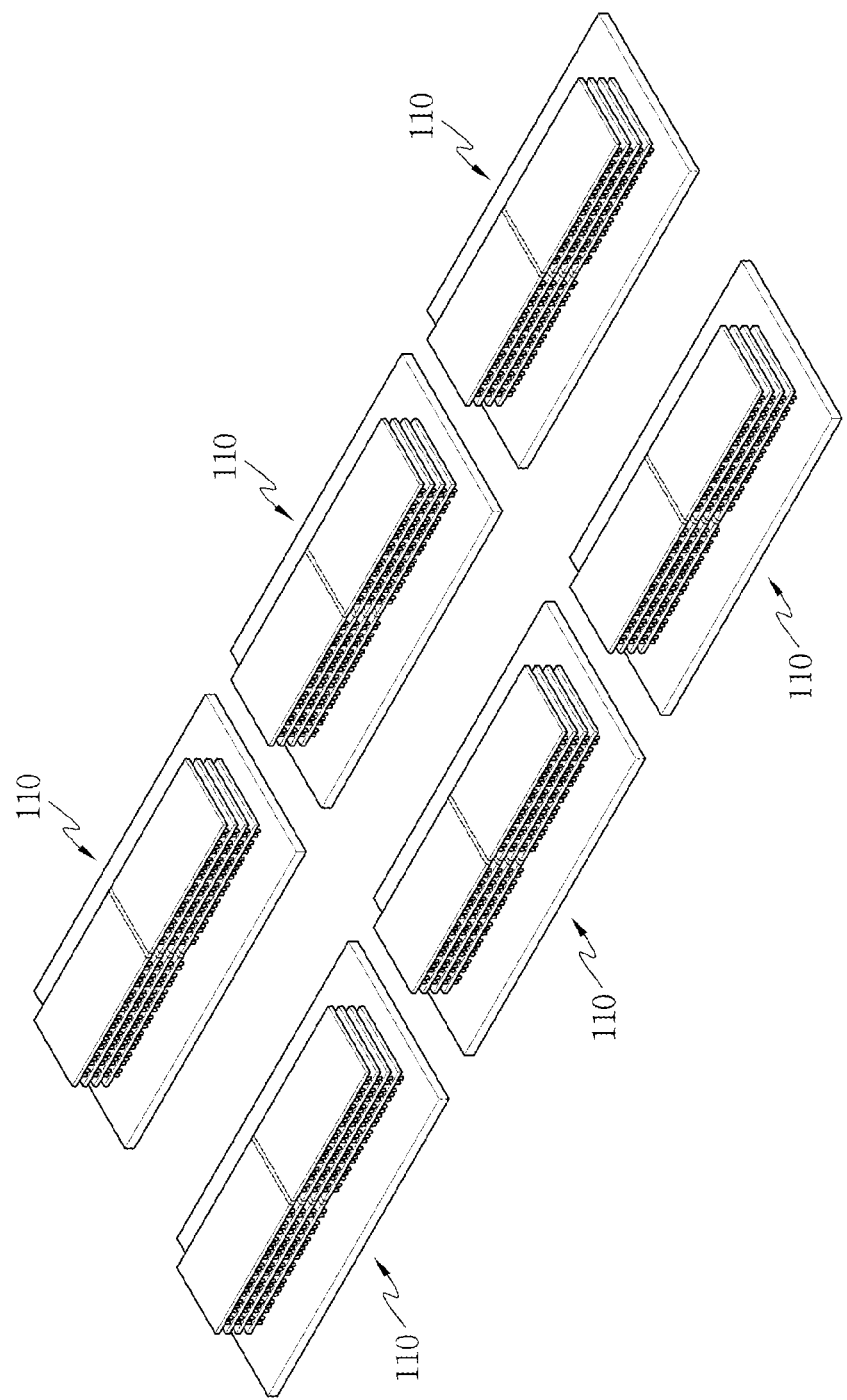

FIGS. 11A to 11C are views for schematically describing a method of fabricating a semiconductor package in accordance with an embodiment of the inventive concept.

Referring to FIG. 11A, the method may include separating the lowest semiconductor devices 131 having two unit semiconductor chips 131a and 131b by performing the processes described with further reference to FIGS. 10A and 10B, forming the lowermost inter-chip bumps 150l on a bottom of the lowermost semiconductor devices 131, and installing the lowermost semiconductor devices 131 on a package board 11. Each of the lowermost semiconductor devices 131 may be electrically connected to the package board 11 using the lowermost inter-chip bumps 150l. The lowermost inter-chip bumps 150l may include a solder ball or a metal pillar. An underfill material surrounding the lowermost inter-chip bumps 150l may fill between the package board 11 and the lowermost semiconductor devices 131.

Referring to FIG. 11B, the method may include stacking first intermediate semiconductor devices 132 on the lowermost semiconductor devices 131, stacking second intermediate semiconductor devices 133 on the first intermediate semiconductor devices 132, and the uppermost semiconductor devices 134 on the second intermediate semiconductor devices 133, thereby forming semiconductor stack structures 120. Each of the semiconductor devices 132, 133, and 134 may be electrically connected using inter-chip bumps 150. A filler or an adhesive material surrounding the inter-chip bumps 150 may be interposed between the semiconductor devices 132, 133, and 134.

Referring to FIG. 11C, the method may include separating individual semiconductor packages 110 having one of the semiconductor stack structures 120 by sawing the package board 111. Before or after performing this process, a molding material covering the semiconductor stack structures 120 may be formed.

Figure 12A:
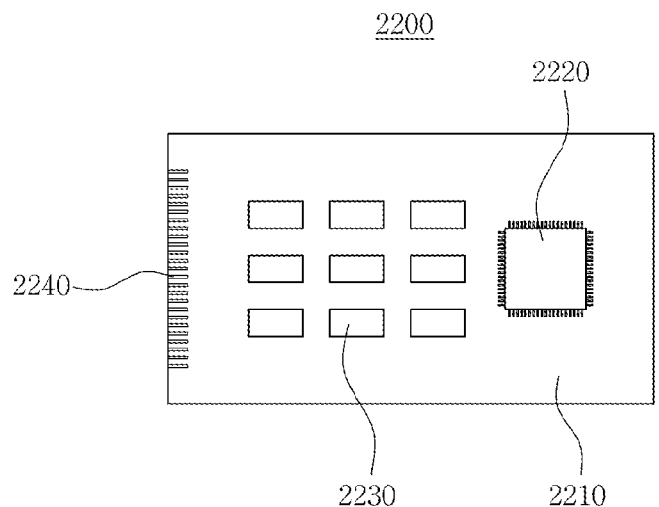
FIG. 12A is a view schematically showing a semiconductor module including at least one semiconductor package in accordance with various embodiments of the inventive concept.

FIG. 12A is a view schematically showing a semiconductor module 2200 including at least one of the semiconductor packages 10a to 10t and 110a to 110g in accordance with various embodiments of the inventive concept described above. Referring to FIG. 12A, the semiconductor module 2200 may include one of the semiconductor packages 10a to 10t and 110a to 110g in accordance with various embodiments of the inventive concept mounted on a semiconductor module substrate 2210. The semiconductor module 2200 may further include a microprocessor 2220 mounted on the module substrate 2210. Input/output terminals 2240 may be arranged on at least one edge of the module substrate 2210.

Figure 12B:
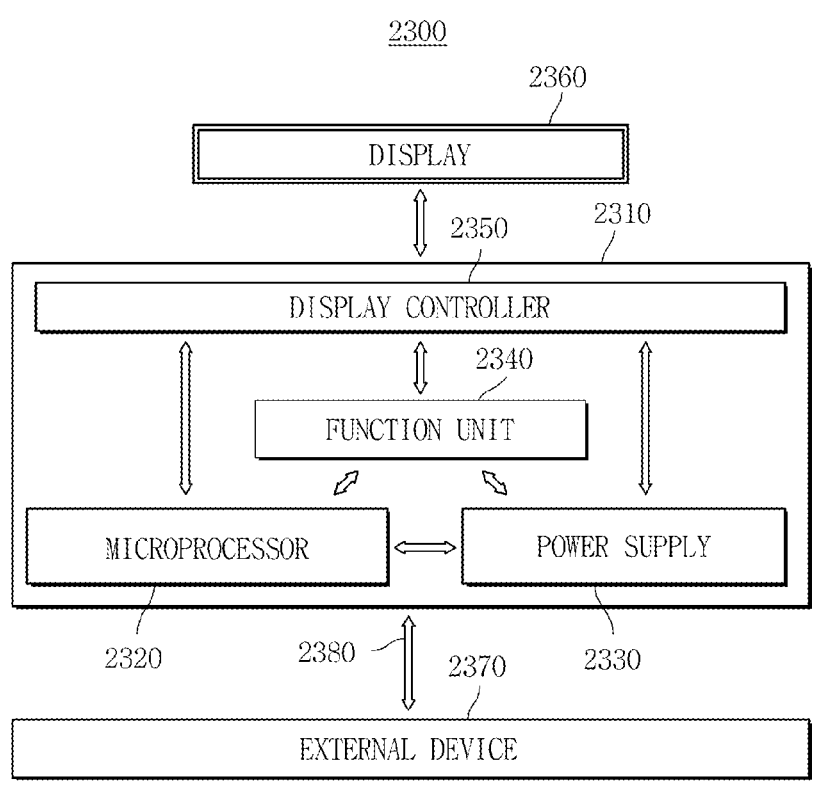
FIGS. 12B and 12C are block diagrams schematically showing electrical systems including at least one semiconductor package in accordance with various embodiments of the inventive concept.

FIG. 12B is a block diagram schematically showing an electronic system 2300 including at least one of the semiconductor packages 10a to 10t and 110a to 110g in accordance with various embodiments of the inventive concept. Referring to FIG. 12B, the semiconductor packages 10a to 10t and 110a to 110g in accordance with various embodiments of the inventive concept may be applied to the electronic system 2300. The electronic system 2300 may include a body 2310. The body 2310 may include a microprocessor 2320, a power supply 2330, a function unit 2340, and/or a display controller 2350. The body 2310 may be a system board or a motherboard including a printed circuit board (PCB), etc. The microprocessor 2320, the power supply 2330, the function unit 2340, and the display controller 2350 may be mounted or installed on the body 2310. A display 2360 may be arranged on an upper surface or an outside of the body 2310. For example, the display 2360 may be arranged on a surface of the body 2310 and display an image processed by the display controller 2350 of the body 2310. The power supply 2330 may receive a constant voltage from an external power source, etc., divide the voltage into various levels, and supply those voltages to the microprocessor 2320, the function unit 2340, and the display controller 2350, etc. The microprocessor 2320 may receive a voltage from the power supply 2330 to control the function unit 2340 and the display 2360. The function unit 2340 may perform various functions of the electronic system 2300. For example, when the electronic system 2300 is a mobile electronic product such as a mobile phone, the function unit 2340 may have several components, which can perform wireless communication functions, such as output of an image to the display unit 2360 or output of a voice to a speaker, by dialing or communication with an external device. If a camera is installed, the function unit 2340 may function as an image processor. In other embodiments, when the electronic system 2300 is connected to a memory card, etc. in order to expand capacity, the function unit 2340 may be a memory card controller. The function unit 2340 may exchange signals with the external device 2370 through a wired or wireless communication unit 2380. In addition, when the electronic system 2300 needs a universal serial bus (USB), etc. in order to expand functionality, the function unit 2340 may function as an interface controller. The semiconductor packages 10a to 10t and 110a to 110g described in various embodiments of the inventive concept may be included in at least one of the microprocessor 2320 and the function unit 2340.

Figure 12C:
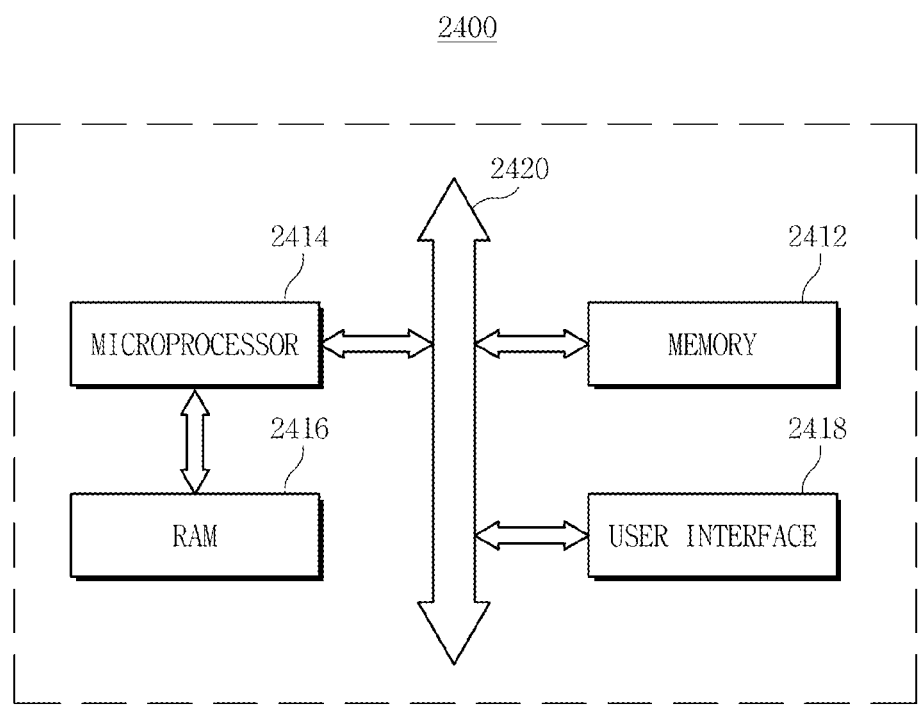

FIG. 12C is a block diagram schematically showing another electronic system 2400 including at least one of the semiconductor packages 10a to 10t and 110a to 110g in accordance with various embodiments of the inventive concept. Referring to FIG. 12C, the electronic system 2400 may include at least one of the semiconductor packages 10a to 10t and 110a to 110g in accordance with various embodiments of the inventive concept. The electronic system 2400 may be used to fabricate a mobile apparatus or a computer. For example, the electronic system 2400 may include a memory system 2412, a microprocessor 2414, a random access memory (RAM) 2416, and a user interface 2418 performing data communication using a bus 2420. The microprocessor 2414 may program and control the electronic system 2400. The RAM 2416 may be used as an operation memory of the microprocessor 2414. For example, the microprocessor 2414 or the RAM 2416 may include at least one of the semiconductor packages 10a to 10t and 110a to 110g in accordance with the embodiments of the inventive concept. The microprocessor 2414, the RAM 2416, and/or other components can be assembled in a single package. The user interface 2418 may be used to input/output data to/from the electronic system 2400. The memory system 2412 may store codes for operating the microprocessor 2414, data processed by the microprocessor 2414, or external input data. The memory system 2412 may include a controller and a memory.

Figure 12D:
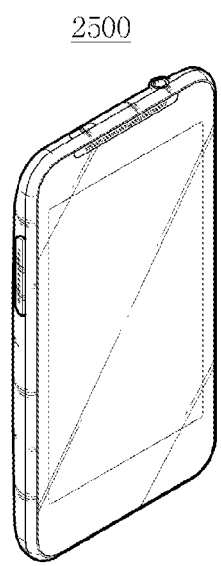
FIG. 12D is a view schematically showing a mobile apparatus including at least one semiconductor package in accordance with various embodiments of the inventive concept.

FIG. 12D is a view schematically showing a mobile apparatus 2500, which may include at least one of the semiconductor packages 10a to 10t and 110a to 110g in accordance with various embodiments of the inventive concept. The mobile apparatus 2500 may include a mobile phone or a tablet PC. In addition, at least one of the semiconductor packages 10a to 10t and 110a to 110g in accordance with various embodiments of the inventive concept may be used in a portable computer such as a notebook, an MPEG-1 Audio Layer 3 (MP3) player, an MP4 player, a navigation apparatus, a solid state disk (SSD), a desktop computer, an automobile, or a home appliance, as well as a mobile phone or a tablet PC.

Since the semiconductor packages in accordance with various embodiments of the inventive concept have a stack structure of semiconductor devices including unified semiconductor chips, the occupying area of the semiconductor stack structure and the size of the semiconductor package may be reduced.

Since the semiconductor packages in accordance with various embodiments of the inventive concept have unified semiconductor chips, the fabrication process is simplified, and the semiconductor stack structure has superior physical durability.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures.

What is claimed is:
1. A semiconductor package, comprising:
a semiconductor stack structure mounted on a package board,
wherein the semiconductor stack structure includes sequentially stacked first to fourth semiconductor devices,
wherein each of the first to fourth semiconductor devices includes a first unit semiconductor chip, a second unit semiconductor chip, a scribe lane between the first unit semiconductor chip and the second unit semiconductor chip, and wherein the first unit semiconductor chip, the second unit semiconductor chip, and the scribe lane are unified at a wafer-level.
2. The semiconductor package of claim 1, wherein the scribe lanes of the first to fourth semiconductor devices are vertically aligned.
3. The semiconductor package of claim 1, wherein the scribe lanes are parts of a silicon wafer and include silicon oxide, silicon nitride, and a metal.
4. The semiconductor package of claim 1, wherein top surfaces and bottom surfaces of the first unit semiconductor chip, the second unit semiconductor chip, and the corresponding scribe lanes are horizontally flat.
5. The semiconductor package of claim 1, wherein the first unit semiconductor chip, the second unit semiconductor chip, and the corresponding scribe lanes are horizontally physically continuous for each of the first to fourth semiconductor devices.
6. The semiconductor package of claim 1, wherein the first to fourth semiconductor devices of the semiconductor stack structure are stacked in a form of a cascade in a first horizontal direction.
7. The semiconductor package of claim 6, wherein the semiconductor stack structure further comprises fifth to eighth semiconductor devices stacked in a form of a cascade in a second horizontal direction opposite to the first horizontal direction on the first to fourth semiconductor devices, and each of the fifth to eighth semiconductor devices includes a first unit semiconductor chip, a second unit semiconductor chip, and a scribe lanes therebetween.
8. The semiconductor package of claim 7, further comprising:
first bonding wires electrically connecting a first board pad on the package board, a first chip pad of the first semiconductor device, a second chip pad of the second semiconductor device, a third chip pad of the third semiconductor device, and a fourth chip pad of the fourth semiconductor device; and
second bonding wires electrically connecting a second board pad on the package board, a fifth chip pad of the fifth semiconductor device, a sixth chip pad of the sixth semiconductor device, a seventh chip pad of the seventh semiconductor device, and an eighth chip pad of the eighth semiconductor device.
9. The semiconductor package of claim 1, wherein each of the first unit semiconductor chip and the second unit semiconductor chip comprises four edges and first and second chip pad arrays arranged adjacent to one of the four edges,
wherein the first chip pad array of the first unit semiconductor chip is structurally the same as the second chip pad array of the second unit semiconductor chip.
10. The semiconductor package of claim 9, wherein the package board comprises a first board pad array having the same arrangement as the first chip pad array, and a second board pad array having the same arrangement as the second chip pad array.
11. The semiconductor package of claim 10, wherein an Nth board pad of the first board pad array of the package board, an Nth chip pad of the first chip pad array of the first unit semiconductor chip of the first semiconductor device, an Nth chip pad of the first chip pad array of the first unit semiconductor chip of the second semiconductor device, an Nth chip pad of the first chip pad array of the first unit semiconductor chip of the third semiconductor device, and an Nth chip pad of the first chip pad array of the first unit semiconductor chip of the fourth semiconductor device are electrically connected.

12. The semiconductor package of claim 11, further comprising a buffering device electrically connected to the Nth board pads and all of the Nth chip pads.

13. A semiconductor package, comprising:
a semiconductor stack structure mounted on a package board,
wherein the semiconductor stack structure includes sequentially stacked semiconductor devices which are structurally the same as each other,
wherein each of the structurally same semiconductor devices include a plurality of unit semiconductor chips and a scribe lane between the unit semiconductor chips,
wherein each of the plurality of unit semiconductor chips is structurally the same as each other, and
wherein the plurality of the structurally same unit semiconductor chips and the scribe lane included in one semiconductor device from among the semiconductor devices, are unitary and physically continuous with each other.

14. The semiconductor package of claim 13, wherein the semiconductor stack structure is in the form of a unidirectional cascade.

15. The semiconductor package of claim 14, further comprising at least one of a control device and a buffering device disposed on an upper surface of the package board in a shady area of the semiconductor stack structure.

16. The semiconductor package of claim 14, further comprising a control device and a buffering device disposed on an upper surface of the package board adjacent to the semiconductor stack structure.

17. The semiconductor package of claim 16, wherein:
the control device includes a control pad,
the package board includes a control board pad, a board pad, and a board wire,
the control pad is electrically connected to the control board pad through a control wire, and
the control board pad is electrically connected to the board pad through the board wire.

18. The semiconductor package of claim 17, wherein:
the board pad is referred to as a first board pad,
the board wire is referred to as a first board wire,
the buffering device includes a buffering pad,
the package board includes a buffering board pad, a second board pad, and a second board wire,
the buffering pad is electrically connected to the buffering board pad through a buffering wire, and
the buffering board pad is electrically connected to the second board pad through the second board wire.

19. The semiconductor package of claim 1, wherein the scribe lane comprises test element groups (TEG) and alignment key patterns.

20. The semiconductor package of claim 13, wherein the scribe lane comprises test element groups (TEG) and alignment key patterns.

* * * * *